US012581841B2

(12) United States Patent
Lee et al.

(10) Patent No.: US 12,581,841 B2
(45) Date of Patent: Mar. 17, 2026

(54) DISPLAY APPARATUS

(71) Applicant: SAMSUNG DISPLAY CO., LTD.,
Yongin-si (KR)

(72) Inventors: Wangwoo Lee, Yongin-si (KR);
Sungho Kim, Yongin-si (KR); **Seokje
Seong, Yongin-si (KR); Jinsung An**,
Yongin-si (KR); Minwoo Woo,
Yongin-si (KR); Seunghyun Lee,
Yongin-si (KR); Jiseon Lee, Yongin-si
(KR); Yoonjong Cho, Yongin-si (KR)

(73) Assignee: SAMSUNG DISPLAY CO., LTD.,
Gyeonggi-Do (KR)

( * ) Notice: Subject to any disclaimer, the term of this
patent is extended or adjusted under 35
U.S.C. 154(b) by 803 days.

(21) Appl. No.: 17/851,444

(22) Filed: Jun. 28, 2022

(65) Prior Publication Data
US 2023/0006025 A1 Jan. 5, 2023

(30) Foreign Application Priority Data

Jun. 30, 2021 (KR) ........................ 10-2021-0085763

(51) Int. Cl.
*H10K 59/80* (2023.01)
*H10K 59/122* (2023.01)
(Continued)

(52) U.S. Cl.
CPC ....... *H10K 59/8791* (2023.02); *H10K 59/122*
(2023.02); *H10K 59/123* (2023.02);
(Continued)

(58) Field of Classification Search
CPC .............. H10K 50/86; H10K 59/8791; H10K
59/8792; H10K 50/865
See application file for complete search history.

(56) References Cited

U.S. PATENT DOCUMENTS 8,004,180 B2 8/2011 Seo
10,734,466 B2 8/2020 Han et al.
(Continued)

FOREIGN PATENT DOCUMENTS

CN 111180494 A * 5/2020 ......... H01L 27/3234
KR 101415794 B1 7/2014
(Continued)

*Primary Examiner* — Eliseo Ramos Feliciano
*Assistant Examiner* — Adam Joseph Mott
(74) *Attorney, Agent, or Firm* — CANTOR COLBURN
LLP

(57) ABSTRACT
A display apparatus includes: a substrate including a main
display area and an auxiliary display area, the auxiliary
display area including a component area and a middle area;
a main pixel circuit, and a main display element connected
to the main pixel circuit; a first auxiliary display element
arranged in the component area; a first auxiliary pixel
circuit, a second auxiliary pixel circuit, and a second aux-
iliary display element connected to the second auxiliary
pixel circuit, which are arranged in the middle area; a
connection wiring connecting the first auxiliary display
element and the first auxiliary pixel circuit; and a reflection
reduction layer provided between the substrate and the first
auxiliary display element to correspond to the first auxiliary
display element, in which the first auxiliary display element
includes a first auxiliary pixel electrode, and the reflection
reduction layer completely overlaps the first auxiliary pixel
electrode in a plan view.

20 Claims, 29 Drawing Sheets

(51) Int. Cl.

| | |
|---|---|
| *H10K 59/123* | (2023.01) |
| *H10K 59/131* | (2023.01) |
| *H10K 59/00* | (2023.01) |
| *H10K 59/10* | (2023.01) |
| *H10K 59/126* | (2023.01) |
| *H10K 59/95* | (2023.01) |

(52) U.S. Cl.

CPC ....... *H10K 59/131* (2023.02); *H10K 59/8792* (2023.02); *H10K 59/00* (2023.02); *H10K 59/10* (2023.02); *H10K 59/126* (2023.02); *H10K 59/95* (2023.02)

(56) References Cited

U.S. PATENT DOCUMENTS

| | | | |
|---|---|---|---|
| 11,152,593 B1 | 10/2021 | Zheng | |
| 2018/0102502 A1* | 4/2018 | Kim | H01L 22/12 |
| 2020/0185643 A1* | 6/2020 | Moon | G02F 1/1339 |
| 2021/0066648 A1 | 3/2021 | Chung et al. | |

| | | | |
|---|---|---|---|
| 2021/0167163 A1* | 6/2021 | Jeong | G06F 3/04164 |
| 2021/0193967 A1* | 6/2021 | Xu | H10K 59/122 |
| 2021/0202594 A1* | 7/2021 | Jo | H10K 59/121 |
| 2021/0249494 A1* | 8/2021 | You | H10K 59/121 |
| 2021/0328182 A1* | 10/2021 | Zheng | H10K 59/124 |
| 2022/0069048 A1* | 3/2022 | Bok | H10K 59/131 |
| 2022/0123270 A1* | 4/2022 | Lee | H10K 50/865 |
| 2022/0131110 A1* | 4/2022 | Ishizuya | H10K 59/878 |
| 2022/0140014 A1* | 5/2022 | Shim | H10K 59/121 |
| | | | 257/40 |
| 2022/0285475 A1* | 9/2022 | Hong | H10K 59/122 |
| 2023/0165119 A1* | 5/2023 | Wang | H10K 59/873 |
| | | | 257/40 |

FOREIGN PATENT DOCUMENTS

| | | | | | |
|---|---|---|---|---|---|
| KR | 1020140107028 A | | 9/2014 | | |
| KR | 10-2020-0050827 A | | 5/2020 | | |
| KR | 1020200073340 A | | 6/2020 | | |
| KR | 102207605 B1 | * | 1/2021 | .......... | H10K 59/878 |
| KR | 102226726 B1 | | 3/2021 | | |
| WO | 2020248348 A1 | | 12/2020 | | |

* cited by examiner

| | REFLECTIVITY | |
|---|---|---|
| | 1/12 PXL | 1/6 PXL |
| COMPARATIVE EXAMPLE | 27.6% | 31.3% |
| EMBODIMENT 1 | 13.3% | 12.8% |
| EMBODIMENT 2 | 27.1% | 30.6% |
| EMBODIMENT 3 | 13.7% | 13.3% |

FIG. 22

| REFLECTIVITY | | COMPARATIVE EXAMPLE | EMBODIMENT 1 | EMBODIMENT 2 | EMBODIMENT 3 | EMBODIMENT 4 (EMBODIMENT 2+3) |
|---|---|---|---|---|---|---|
| 143 ppi | B (440~460nm) | 17.89% | 8.54% | 16.73% | 12.46% | 16.70% |
| | G (540~560nm) | 28.29% | 11.09% | 19.33% | 7.90% | 16.97% |
| | R (640~660nm) | 33.38% | 20.50% | 68.64% | 9.79% | 65.46% |
| 202 ppi | B (440~460nm) | 16.45% | 8.54% | 16.74% | 12.48% | 16.70% |
| | G (540~560nm) | 29.37% | 11.09% | 19.88% | 7.90% | 16.97% |
| | R (640~660nm) | 37.83% | 20.50% | 69.57% | 9.79% | 65.46% |

DISPLAY APPARATUS

This application claims priority to Korean Patent Application No. 10-2021-0085763, filed on Jun. 30, 2021, and all the benefits accruing therefrom under 35 U.S.C. § 119, the content of which in its entirety is herein incorporated by reference.

BACKGROUND

1. Field

One or more embodiments relate to display apparatuses, and more particularly, to display apparatuses which provide high quality images, and simultaneously in which the quality of images output through a component is improved.

2. Description of the Related Art

Generally, a display apparatus includes a display element and electronic components to control electrical signals applied to the display element. The electronic components include thin film transistors ("TFTs"), storage capacitors, and a plurality of wirings.

The display apparatus is used for various purposes. Furthermore, the thickness and weight of the display apparatus is gradually reduced, and a range of use of the display apparatus is expanding. As the range of use of the display apparatus is diversified, various methods of designing the shape of the display apparatus are being studied.

SUMMARY

However, in a display apparatus according to the related art, it is a problem that the quality of an image deteriorates during camera photographing in a design process of displaying a high quality image.

One or more embodiments include display apparatuses which may provide high quality images, and simultaneously in which the quality of images output through a component is improved. However, such an aspect is exemplary, and the scope of the present disclosure is not limited thereby.

Additional aspects will be set forth in part in the description which follows and, in part, will be apparent from the description, or may be learned by practice of the presented embodiments of the disclosure.

According to one or more embodiments, a display apparatus includes: a substrate including a main display area and an auxiliary display area, the auxiliary display area including a component area and a middle area, a main pixel circuit arranged in the main display area, and a main display element connected to the main pixel circuit, a first auxiliary display element arranged in the component area, a first auxiliary pixel circuit, a second auxiliary pixel circuit, and a second auxiliary display element connected to the second auxiliary pixel circuit, which are arranged in the middle area, a connection wiring connecting the first auxiliary display element and the first auxiliary pixel circuit, and a reflection reduction layer provided between the substrate and the first auxiliary display element to correspond to the first auxiliary display element, in which the first auxiliary display element includes a first auxiliary pixel electrode, and the reflection reduction layer completely overlaps the first auxiliary pixel electrode in a plan view.

According to an embodiment, the reflection reduction layer may include a first metal material.

According to an embodiment, the first metal material may have reflectivity lower than a reflectivity of a second metal material included in the first auxiliary pixel electrode.

According to an embodiment, the first metal material may include at least one of molybdenum (Mo), aluminum (Al), or titanium (Ti).

According to an embodiment, the display apparatus may further include a bottom metal layer provided between the substrate and the first auxiliary pixel circuit, and arranged to overlap the first auxiliary pixel circuit and the second auxiliary pixel circuit in the plan view, where the reflection reduction layer may include the same material as the bottom metal layer.

According to an embodiment, the first auxiliary pixel circuit may include a thin film transistor which includes a semiconductor layer, a gate electrode, and an electrode layer connected to the semiconductor layer, and the reflection reduction layer may include the same material as the gate electrode.

According to an embodiment, the first auxiliary pixel circuit may include a thin film transistor which includes a semiconductor layer, a gate electrode, and an electrode layer connected to the semiconductor layer, and the reflection reduction layer may include the same material as the electrode layer.

According to an embodiment, the reflection reduction layer may include a silicon-based semiconductor material.

According to an embodiment, the reflection reduction layer may include an organic material.

According to an embodiment, the organic material may include a colored light shield material.

According to an embodiment, the display apparatus may further include: an insulating layer covering an edge of the first auxiliary pixel electrode and exposing a central portion of the first auxiliary pixel electrode, where the insulating layer may include a colored light shield material.

According to an embodiment, a width of the reflection reduction layer may be equal to or greater than a width of the first auxiliary pixel electrode.

According to an embodiment, the width of the reflection reduction layer may be equal to or less than a width of the insulating layer.

According to an embodiment, when viewed in a direction perpendicular to the substrate, an outline of the first auxiliary pixel electrode may be curved.

According to an embodiment, when viewed in the direction perpendicular to the substrate, the first auxiliary pixel electrode may have a circular or oval shape.

According to an embodiment, the reflection reduction layer may include a first reflection reduction layer and a second reflection reduction layer which completely overlap the first auxiliary pixel electrode in the plan view.

According to an embodiment, the first reflection reduction layer and the second reflection reduction layer may include materials different from each other.

According to an embodiment, the connection wiring may include a transmissive conductive layer.

According to an embodiment, the component area may include a first area and a second area, and the connection wiring may include a first connection wiring extending in a first direction in the first area, and a second connection wiring extending in a second direction crossing the first direction in the second area.

According to an embodiment, the first auxiliary display element may include a plurality of first auxiliary display elements in the component area, the component area may include a transmission area, and the transmission area may be arranged between the first auxiliary display elements.

Other aspects, features, and advantages than those described above will become apparent from the following drawings, claims, and detailed description of the disclosure.

These general and specific aspects may be embodied using a system, a method, a computer program, or any combination of a system, a method, and a computer program.

BRIEF DESCRIPTION OF THE DRAWINGS

The above and other aspects, features, and advantages of certain embodiments of the disclosure will be more apparent from the following description taken in conjunction with the accompanying drawings, in which:

FIGS. 2 and 3 are schematic cross-sectional views of display apparatuses according to one or more embodiments;

FIG. 11 is a detailed plan view of part of the auxiliary display area of FIG. 10;

FIG. 22 is a table showing a measurement of reflectivity of each subpixel, according to the graph of FIG. 21.

DETAILED DESCRIPTION

Figure 1A:
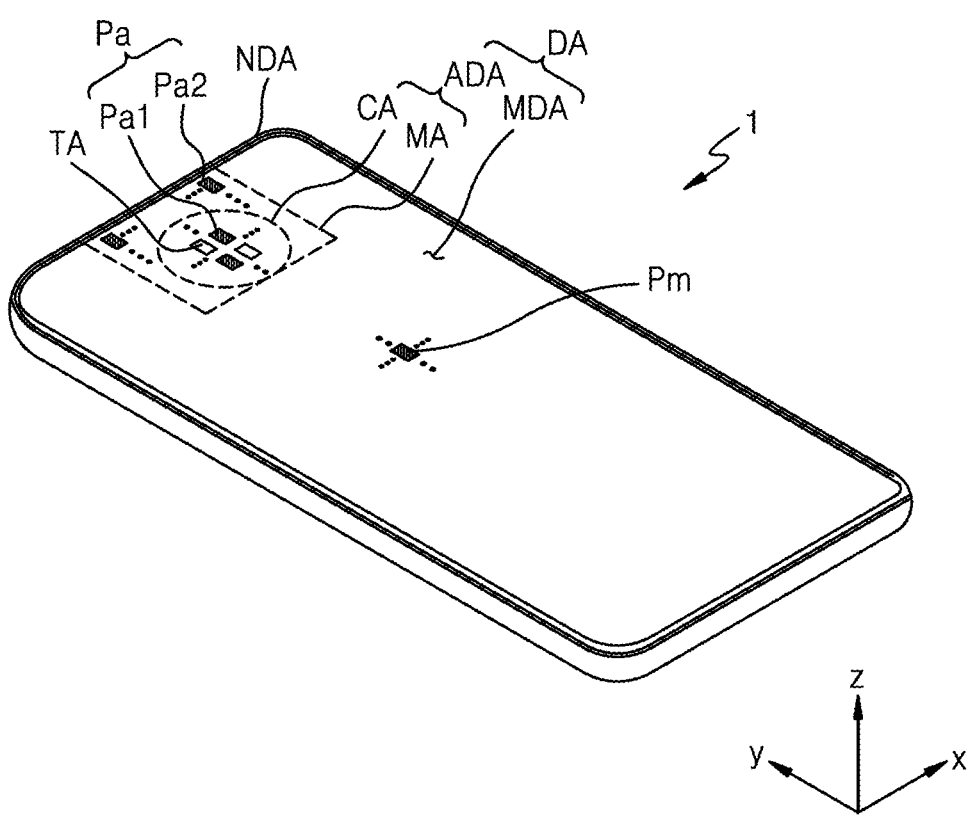
FIGS. 1A to 1C are schematic perspective views of display apparatuses according to one or more embodiments.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Various modifications may be applied to the present embodiments, and particular embodiments will be illustrated in the drawings and described in the detailed description section. The effect and features of the present embodiments, and a method to achieve the same, will be clearer referring to the detailed descriptions below with the drawings. However, the present embodiments may be implemented in various forms, not by being limited to the embodiments presented below.

Hereinafter, exemplary embodiments will be described in detail with reference to the accompanying drawings, and in the description with reference to the drawings, the same or corresponding constituents are indicated by the same reference numerals and redundant descriptions thereof are omitted.

It will be understood that although the terms "first," "second," etc. may be used herein to describe various components, these components should not be limited by these terms. These components are only used to distinguish one component from another.

As used herein, the singular forms are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on" another layer, region, or component, it can be directly or indirectly formed on the other layer, region, or component. That is, for example, intervening layers, regions, or components may be present.

It will be understood that when a layer, region, or component is referred to as being "connected to" another layer, region, or component, it can be directly connected to the other layer, region, or component or indirectly connected to the other layer, region, or component via intervening layers, regions, or components. For example, in the specification, when a layer, region, or component is referred to as being electrically connected to another layer, region, or component, it can be directly electrically connected to the other layer, region, or component or indirectly electrically connected to the other layer, region, or component via intervening layers, regions, or components.

In the specification, the terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or."

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When a certain embodiment may be implemented differently, a specific process order may be performed differently from the described order. For example, two consecutively described processes may be performed substantially at the same time or performed in an order opposite to the described order.

Figure 1B:
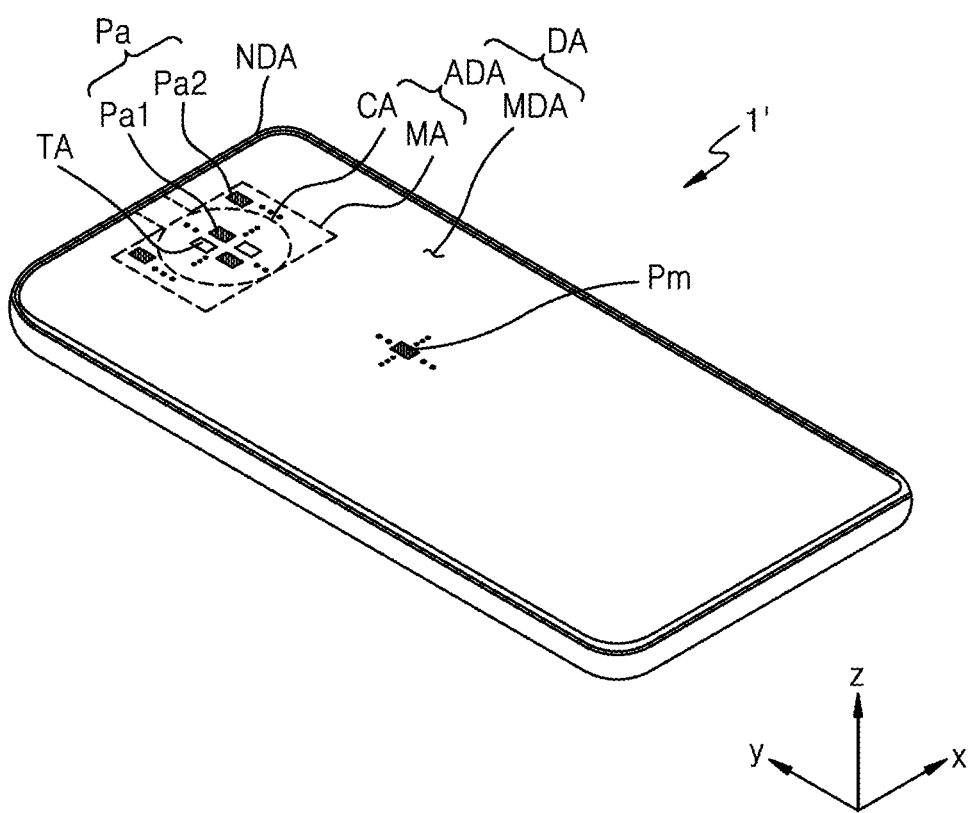
Figure 1C:
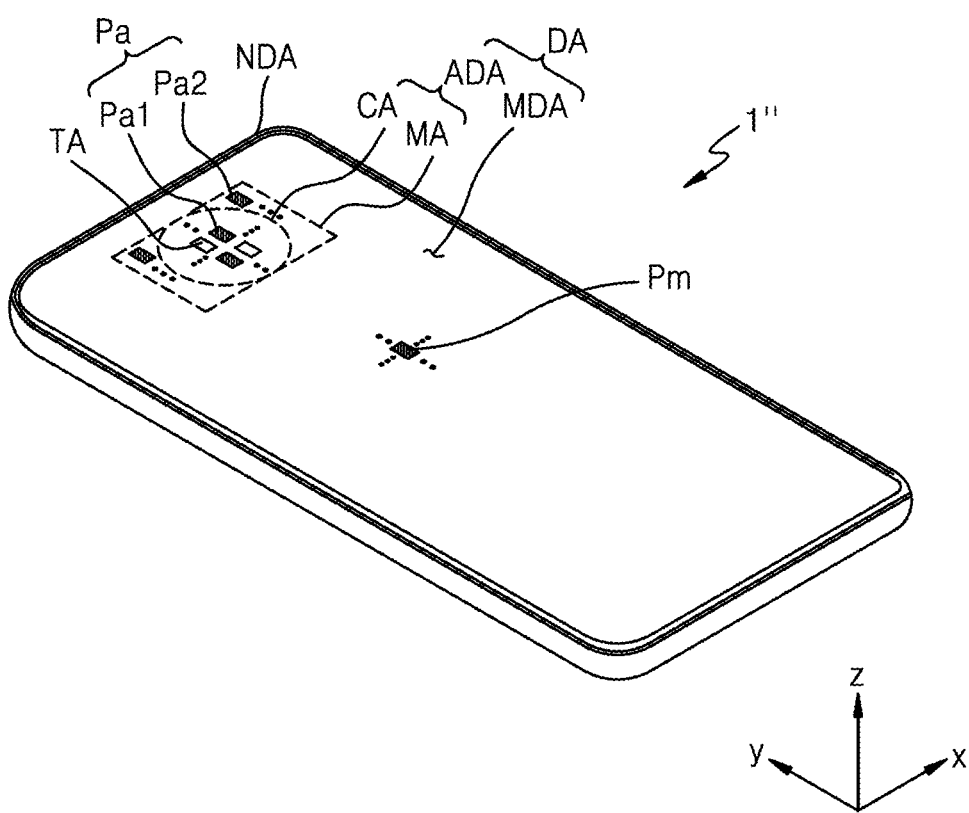

Sizes of components in the drawings may be exaggerated for convenience of explanation. In other words, since sizes and thicknesses of components in the drawings are arbitrarily illustrated for convenience of explanation, the following embodiments are not limited thereto. FIGS. 1A to 1C are schematic perspective views of display apparatuses 1, 1', and 1" according to embodiments.

Referring to FIG. 1A, the display apparatus 1 may include a display area DA and a non-display area NDA outside the display area DA.

The display area DA may include an auxiliary display area ADA and a main display area MDA at least partially surrounding the auxiliary display area ADA. The auxiliary display area ADA displays an auxiliary image, and the main display area MDA displays a main image, and thus the auxiliary display area ADA and the main display area MDA may display images individually or together. The non-display area NDA may be a kind of non-display area in which no display element is arranged. The display area DA may be entirely surrounded by the non-display area NDA. FIG. 1A illustrates that the main display area MDA is arranged to surround at least part of a component area CA.

In another embodiment, the display apparatus 1 may have two or more auxiliary display areas ADAs, and the shapes and sizes of a plurality of auxiliary display areas ADAs may be different from each other. When viewed in a direction (i.e., Z direction) approximately perpendicular to an upper surface of the display apparatus 1 (i.e., plan view), the auxiliary display area ADA may have various shapes such as a circle, an oval, a polygon such as a rectangle or the like, a start, a diamond, or the like. In FIG. 1A, when viewed in a direction approximately perpendicular to the upper surface of the display apparatus 1, the auxiliary display area ADA is arranged at the upper middle part (+y direction) of the main display area MDA approximately having a rectangular shape, but the auxiliary display area ADA may be arranged at one side, for example, the upper right or upper left side of the main display area MDA in another embodiment. The display apparatus 1 may provide an image using a plurality of main subpixels Pm arranged in the main display area MDA and a plurality of first and second auxiliary subpixels Pa1 and Pa2 arranged in the auxiliary display area ADA.

The auxiliary display area ADA may include the component area CA and a middle area MA at least partially surrounding the component area CA. Accordingly, the middle area MA may be located between the component area CA and the main display area MDA. In FIGS. 1A to 1C, while the component area CA remains unchanged, the auxiliary display area ADA may be implemented in various shapes through the deformation of the middle area MA.

The auxiliary display area ADA may be in contact with the non-display area NDA as one side of the auxiliary display area ADA extends to the non-display area NDA as illustrated in FIG. 1A. Alternatively, part of the auxiliary display area ADA extending to the one side may have a relatively narrow width, as illustrated in FIG. 1B, or the auxiliary display area ADA may be located inside the main display area MDA and may not be in contact with the non-display area NDA, as illustrated in FIG. 1C. As described below with reference to FIG. 2, a component 20 that is an electronic component may be arranged below a display panel corresponding to the component area CA. The component area CA may include a transmission area TA through which light or/and sound, or the like output from the component 20 to the outside or traveling toward the component 20 from the outside is transmitted.

In a display panel and a display apparatus including the display panel according to an embodiment of the disclosure, to transmit light through the component area CA, light transmittance may be about 10 percentages (%) or more, particularly 40% or more, 25% or more, 50% or more, 85% or more, or 90% or more.

The first and second auxiliary subpixels Pa1 and Pa2 may be arranged in the auxiliary display area ADA. The first auxiliary subpixel Pa1 may be located in the component area CA, and the second auxiliary subpixel Pa2 may be located in the middle area MA.

The first and second auxiliary subpixels Pa1 and Pa2 may provide a certain image by emitting light. An image display in the auxiliary display area ADA is an auxiliary image, and thus the auxiliary image may have a resolution lower than a resolution of an image displayed in the main display area MDA.

In other words, as the component area CA in the auxiliary display area ADA includes the transmission area TA through which light and sound is transmitted, when no subpixel is arranged in the transmission area TA, the number of first auxiliary subpixels Pa1 arranged in the component area CA per unit area may be less than the number of main subpixels Pm arranged in the main display area MDA per unit area.

Figure 2:
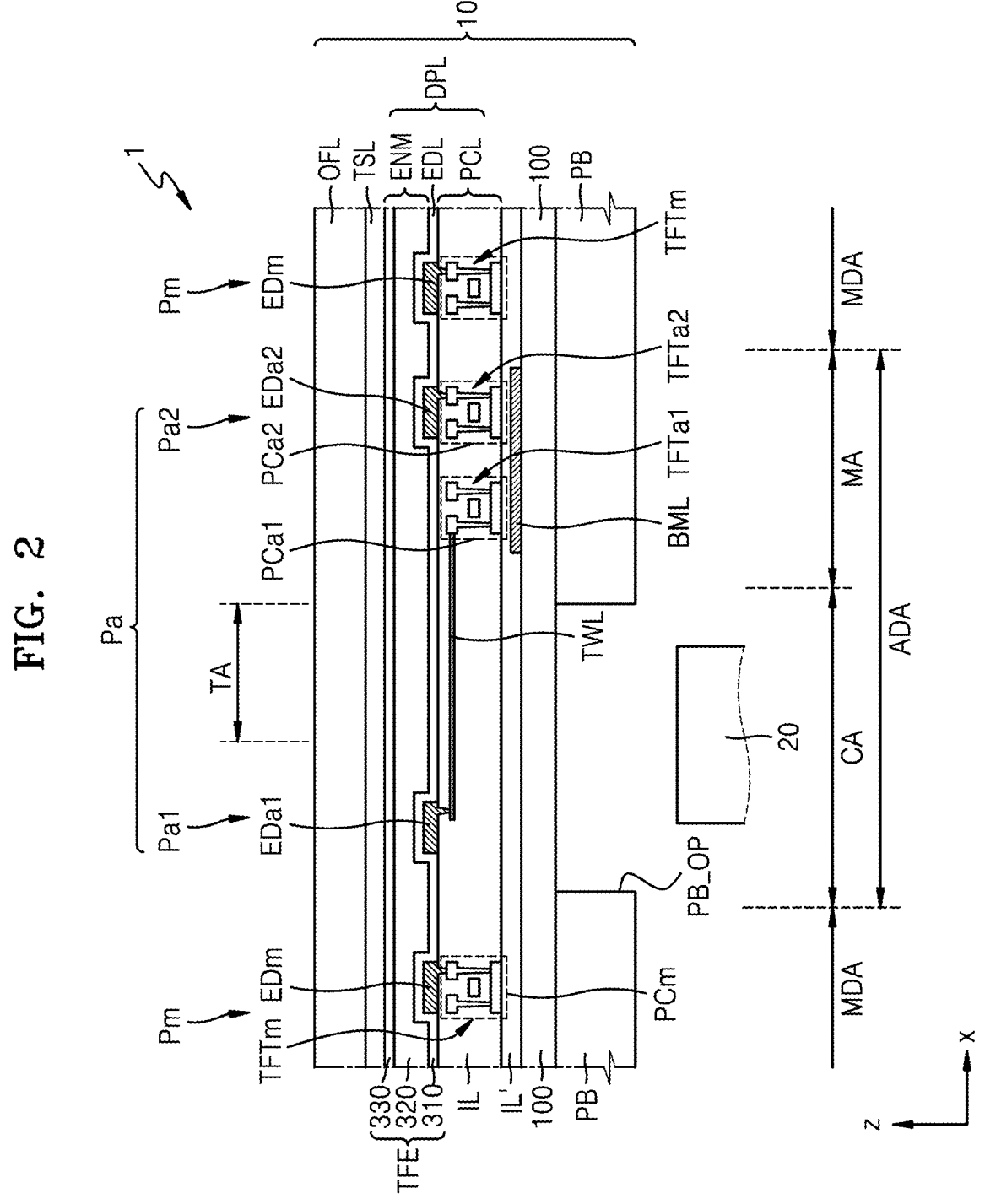

Furthermore, although the middle area MA in the auxiliary display area ADA does not include the transmission area TA, as some pixel circuits, for example, a first auxiliary pixel circuit PCa1 of FIG. 2, arranged in the middle area MA are provided to drive the first auxiliary subpixel Pa1 in the component area CA, the number of second auxiliary subpixels Pa2 arranged in the middle area MA per unit area may be less than the number of main subpixels Pm arranged in the main display area MDA per unit area.

In the following description, although an organic light-emitting display apparatus is described as the display apparatus 1 according to one or more embodiments, the display apparatus according to the disclosure is not limited thereto. In another embodiment, the display apparatus 1 according to one or more embodiments may be display apparatus such as an inorganic light-emitting display or inorganic EL display apparatus or a quantum-dot light-emitting display apparatus. For example, an emission layer of a display element in the display apparatus 1 may include an organic material, an inorganic material, quantum dots, an organic material with quantum dots, or an inorganic material with quantum dots.

Figure 3:
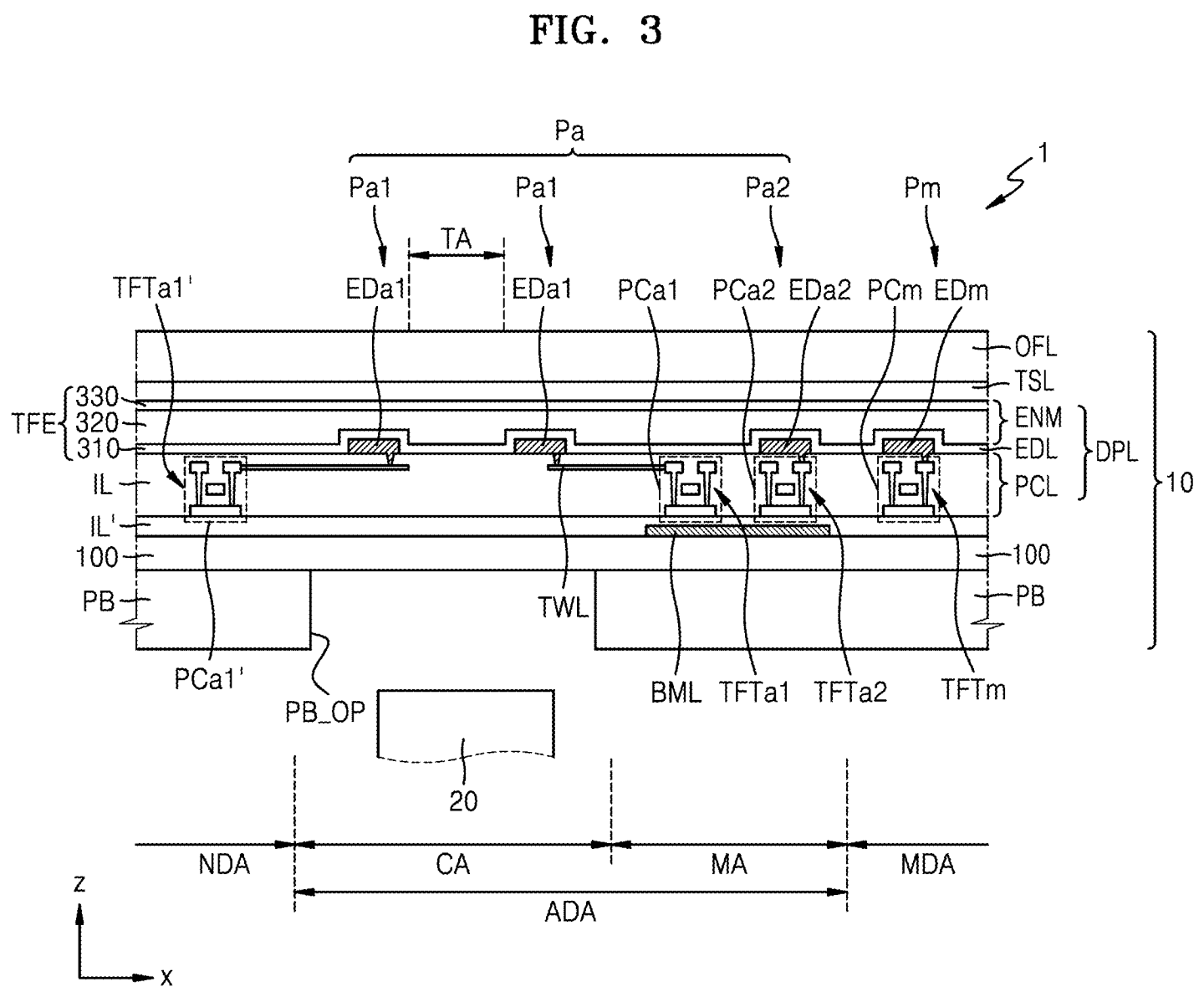

FIGS. 2 and 3 are schematic cross-sectional views of part of the display apparatus 1, according to one or more embodiments.

First, referring to FIG. 2, the display apparatus 1 may include a display panel 10 and the component 20 arranged to overlap the display panel 10. A cover window (not shown) for protecting the display panel 10 may be further arranged above the display panel 10.

The display panel 10 may include the auxiliary display area ADA in which an auxiliary image is displayed and the main display area MDA in which a main image is displayed. The auxiliary display area ADA may include the component area CA that is an area overlapping the component 20 in a plan view and the middle area MA surrounding the component area CA.

The display panel 10 may include a substrate 100, a display layer DPL on the substrate 100, a touchscreen layer TSL, an optical functional layer OFL, and a panel protection member PB arranged below the substrate 100.

The display layer DPL may include a circuit layer PCL including thin film transistors TFTm, TFTa1, and TFTa2, a display element layer EDL including display elements EDm, EDa1, and EDa2 that are light-emitting devices, and a sealing member ENM such as a thin film encapsulation layer TFE or a sealing substrate (not shown). Insulating layers IL and IL' may be arranged in the display layer DPL and between the substrate 100 and the display layer DPL, respectively. For example, the display elements EDm, EDa1, and EDa2 may include an organic light-emitting diode OLED.

The substrate 100 may include an insulating material such as glass, quartz, polymer resin, or the like. The substrate 100 may be a rigid substrate or a flexible substrate capable of bending, folding, rolling, or the like.

A main display element EDm and a main pixel circuit PCm connected thereto may be arranged in the main display area MDA of the display panel 10. The main pixel circuit PCm may include at least one main thin film transistor TFTm, and control an operation of the main display element EDm. The main subpixels Pm may be implemented by the light emission of the main display element EDm.

A first auxiliary display element EDa1 is arranged in the component area CA of the display panel 10 and implementing the first auxiliary subpixel Pa1. In the present embodiment, the first auxiliary pixel circuit PCa1 may be arranged not to overlap the first auxiliary display element EDa1 in the plan view. In other words, the first auxiliary pixel circuit PCa1 that drives the first auxiliary display element EDa1 is not arranged in the component area CA, but is arranged in the middle area MA between the main display area MDA and the component area CA. Alternatively, in another embodiment as illustrated in FIG. 3, the first auxiliary pixel circuit PCa1 that drives the first auxiliary display element EDa1 may be arranged in the middle area MA, and simultaneously, in the non-display area NDA that is a non-display area. The structure of FIG. 3 may correspond to the structure of FIG. 17 that is described below.

The first auxiliary pixel circuit PCa1 may include at least one first auxiliary thin film transistor TFTa1 , and may be electrically connected to the first auxiliary display element EDa1 by a connection wiring TWL. The connection wiring TWL may include a transparent conductive material. The first auxiliary pixel circuit PCa1 may control an operation of the first auxiliary display element EDa1. The first auxiliary subpixel Pa1 may be implemented by the light emission of the first auxiliary display element EDa1.

A partial area of the component area CA, in which the first auxiliary display element EDa1 is not arranged, may be defined as the transmission area TA. The transmission area TA may be an area in which light/signal emitted from the component 20 arranged corresponding to the component area CA or light/signal incident on the component 20 is transmitted.

The connection wiring TWL connecting the first auxiliary pixel circuit PCa1 to the first auxiliary display element EDa1 may be arranged in the transmission area TA. The connection wiring TWL may include a transparent conductive material having high transmittance, and even when the connection wiring TWL is arranged in the transmission area TA, the light transmittance of the transmission area TA may be secured. In the present embodiment, an auxiliary pixel circuit PCa is not arranged in the component area CA, and thus an area of the transmission area TA may be easily extended and the light transmittance may be effectively improved.

A second auxiliary display element EDa2 and a second auxiliary pixel circuit PCa2 connected thereto are arranged in the middle area MA of the display panel 10, thereby implementing the second auxiliary subpixel Pa2. The first auxiliary pixel circuit PCa1 and the second auxiliary pixel circuit PCa2, which are arranged in the middle area MA, may be alternately arranged adjacent to each other.

The display element layer EDL may be covered by the thin film encapsulation layer TFE, as illustrated in FIG. 2, or by the sealing substrate. In an embodiment, the thin film encapsulation layer TFE may include, as illustrated in FIG. 2, at least one inorganic encapsulation layer and at least one organic encapsulation layer. For example, the thin film encapsulation layer TFE may include first and second inorganic encapsulation layers 310 and 330 and an organic encapsulation layer 320 therebetween.

the first inorganic encapsulation layer 310 and the second inorganic encapsulation layer 330 may include one or more inorganic insulating materials such as silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide ($ZnO_2$), and may be formed by a chemical vapor deposition ("CVD") method or the like. The organic encapsulation layer 320 may include a polymer-based material. The polymer-based material may include silicon-based resin, acrylic resin (e.g., polymethyl meta acrylate, polyacryl acid, or the like), epoxy-based resin, polyimide polyethylene, or the like.

The first inorganic encapsulation layer 310, the organic encapsulation layer 320, and the second inorganic encapsulation layer 330 may be integrally formed to cover the main display area MDA and the auxiliary display area ADA.

The touchscreen layer TSL may obtain an external input, for example, coordinates information according to a touch event. The touchscreen layer TSL may include a touch electrode and touch wirings connected to the touch electrode. The touchscreen layer TSL may detect an external input by a self-capacitance method or a mutual capacitance method.

The touchscreen layer TSL may be formed on the thin film encapsulation layer TFE. Alternatively, after separately being formed on a touch substrate, the touchscreen layer TSL may be coupled to the thin film encapsulation layer TFE through an adhesive layer such as an optically clear adhesive ("OCA"). In an embodiment, the touchscreen layer TSL may be formed directly on the thin film encapsulation layer TFE. In this case, the adhesive layer may not be provided between the touchscreen layer TSL and the thin film encapsulation layer TFE.

The optical functional layer OFL may include an antireflection layer. The antireflection layer may reduce reflectivity of light (external light) incident on the display apparatus 1 from the outside. In an embodiment, the optical functional layer OFL may be a polarized film. In another embodiment, the optical functional layer OFL may have an opening (not shown) corresponding to the transmission area TA. Accordingly, the light transmittance of the transmission area TA may be remarkably improved. The opening may be filled with a transparent material such as optically clear resin ("OCR"). In another embodiment, the optical functional layer OFL may include a filter plate including a black matrix and color filters.

The panel protection member PB is attached to a lower portion of the substrate 100, and may support and protect the substrate 100. The panel protection member PB may have an opening PB_OP corresponding to the component area CA. As the panel protection member PB has the opening PB_OP, the light transmittance of the component area CA may be effectively improved. The panel protection member PB may include polyethylene terephthalate or polyimide.

The area of the component area CA may be greater than the area where the component 20 is arranged in the plan view. Accordingly, the area of the opening PB_OP in the panel protection member PB may not match the area of the component area CA. Although FIG. 2 illustrates that the component 20 is arranged at one side of the display panel 10, at least part of the component 20 may be inserted into the opening PB_OP in the panel protection member PB.

The component 20 may be an electronic component using light or sound. For example, the electronic component may include a sensor that measures distance such as a proximity sensor, a sensor that recognizes part of a user's body (e.g., fingerprint, iris, face, or the like), a small lamp that outputs light, an image sensor that captures images (e.g., a camera), or the like. The electronic component using light may use light in various wavelength bands such as visible light, infrared light, ultraviolet light, or the like. The electronic component utilizing sound may use ultrasound or sound in other frequency bands. In some embodiments, the component 20 may include sub-components such as an emission unit and a light receiving unit. The emission unit and the light receiving unit may have an integrated structure or physically separated structures, and a pair of the emission unit and the light receiving unit may form one component 20.

Furthermore, a plurality of components 20 may be arranged in the component area CA. The components 20 may have different functions. For example, the components 20 may include at least two of a camera (an image capturing device), a solar cell, a flash, a proximity sensor, an illuminance sensor, and an iris sensor.

A bottom metal layer BML may be arranged below the first and second auxiliary pixel circuits PCa1 and PCa2 of the middle area MA, as illustrated in FIG. 2. The bottom metal layer BML may be arranged to overlap the pixel circuits in the plan view to protect the pixel circuits. In an embodiment, the bottom metal layer BML may be arranged between the substrate 100 corresponding to the middle area MA and the first and second auxiliary pixel circuits PCa1 and PCa2, to overlap the first and second auxiliary pixel circuits PCa1 and PCa2 in the plan view. The bottom metal layer BML may block the external light from reaching the first and second auxiliary pixel circuits PCa1 and PCa2. In another embodiment, the bottom metal layer BML is formed to corresponding to the whole of the display area DA, and may include a lower hole corresponding to the component area CA. In another embodiment, the bottom metal layer BML may be omitted may be omitted.

Figure 4:
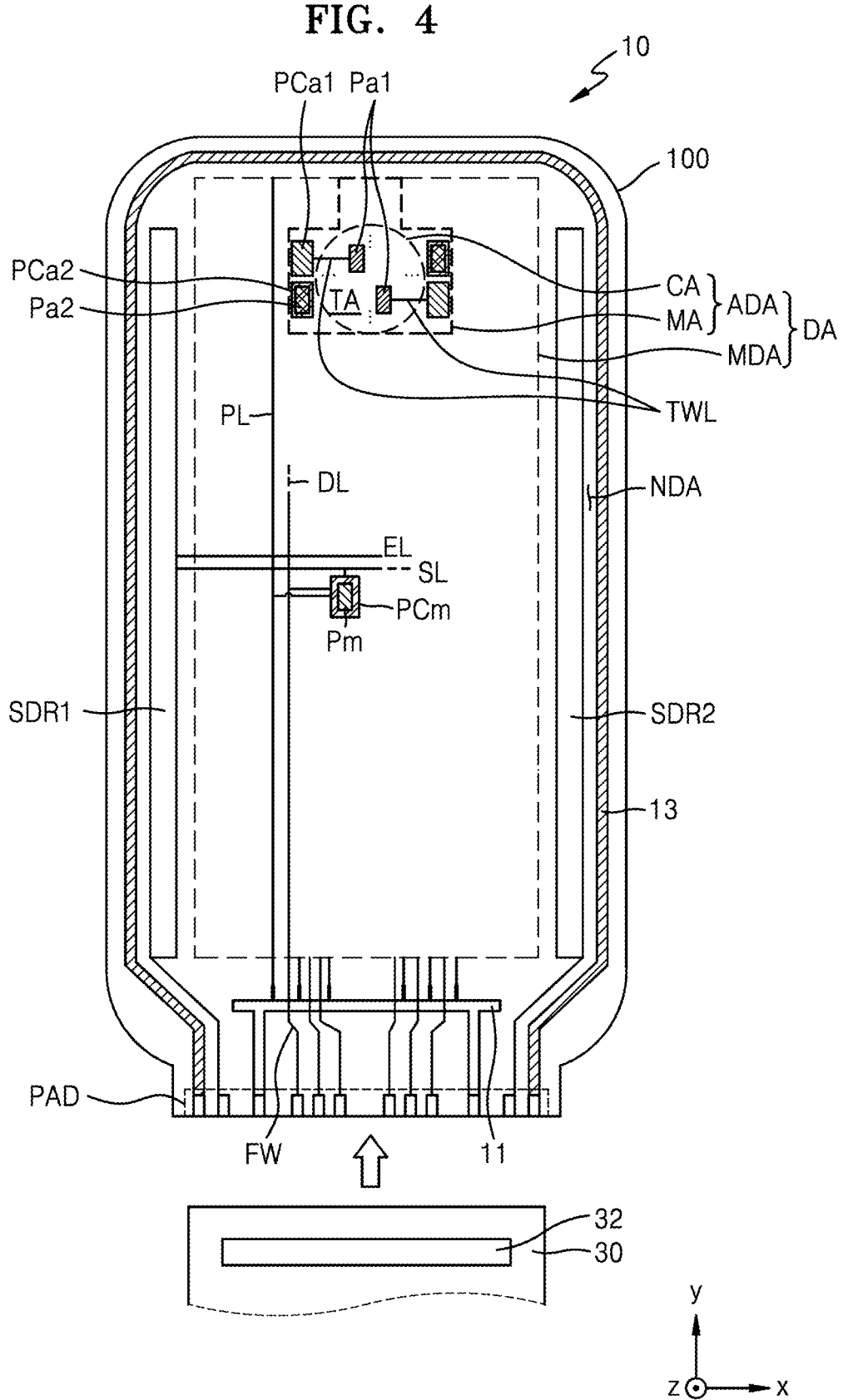
FIG. 4 is a schematic plan view of a display panel to be included in the display apparatuses of FIGS. 1A to 1C.

FIG. 4 is a schematic plan view of a display panel to be included in the display apparatuses of FIGA. 1A to 1C.

Referring to FIG. 4, various constituent elements forming the display panel 10 are arranged on the substrate 100.

The main subpixels Pm are arranged in the main display area MDA. Each of the main subpixels Pm may be implemented as a light-emitting device by a display element such as an organic light-emitting diode OLED. The main pixel circuit PCm that drives the main subpixels Pm is arranged in the main display area MDA, and the main pixel circuit PCm may be arranged to overlap the main subpixels Pm in the plan view. Each of the main subpixels Pm may emit light, for example, red, green, blue, or white light. The main display area MDA is covered by the sealing member ENM, and may be protected from external air, moisture, or the like.

The auxiliary display area ADA may be located at one side of the main display area MDA, as described above, or arranged inside the display area DA and surrounded by the main display area MDA. The first and second auxiliary subpixels Pa1 and Pa2 may be arranged in the auxiliary display area ADA. Each of the first and second auxiliary subpixels Pa1 and Pa2 may be implemented as a light-emitting device by a display element such as an organic light-emitting diode OLED. Each auxiliary subpixel Pa may emit light, for example, red, green, blue, or white light. The auxiliary display area ADA is covered by the sealing member ENM, and may be protected from external air, moisture, or the like.

The auxiliary display area ADA may include the component area CA and the middle area MA at least partially surrounding the component area CA. The first auxiliary subpixel Pa1 may be implemented in the component area CA, and the second auxiliary subpixel Pa2 may be implemented in the middle area MA. In other words, the first auxiliary subpixel Pa1 substantially emits light in the component area CA, and the second auxiliary subpixel Pa2 substantially emits light in the middle area MA.

Both of the first auxiliary pixel circuit PCa1 for driving the first auxiliary subpixel Pa1 and the second auxiliary pixel circuit PCa2 for driving the second auxiliary subpixel Pa2 may be arranged in the middle area MA. In this case, as the first auxiliary display element EDa1 that implements the first auxiliary subpixel Pa1 is arranged in the component area CA, and the first auxiliary pixel circuit PCa1 is arranged in the middle area MA, the first auxiliary display element EDa1 and the first auxiliary pixel circuit PCa1 may be connected to each other by the connection wiring TWL.

The component area CA may have the transmission area TA. The transmission area TA may be defined as an area where the first auxiliary subpixel Pa1 is not arranged.

As the component area CA has the transmission area TA, the resolution of the component area CA may be lower than the resolution of the main display area MDA. For example, the resolution of the component area CA may be about $\frac{1}{2}$, $\frac{3}{8}$, $\frac{1}{3}$, $\frac{1}{4}$, $\frac{2}{9}$, $\frac{1}{8}$, $\frac{1}{9}$, $\frac{1}{16}$, or the like of the resolution of the main display area MDA. For example, the resolution of the main display area MDA may be about 400 pixels per inch (ppi) or more, and the resolution of the component area CA may be about 200 ppi or about 100 ppi.

Furthermore, as one circuit, that is, the first auxiliary pixel circuit PCa1, of two pixel circuits, that is, the first auxiliary pixel circuit PCa1 and the second auxiliary pixel circuit PCa2, in the middle area MA is used to drive the first auxiliary subpixel Pa1 in the component area CA, the resolution of the middle area MA may be lower than the resolution of the main display area MDA and higher than the resolution of the component area CA.

Each of the pixel circuits PCm, PCa1 , and PCa2 that drive the subpixels Pm, Pa1, and Pa2 in the display area DA, respectively, may be electrically connected to outer circuits arranged in the non-display area NDA. A first scan driving circuit SDR1, a second scan driving circuit SDR2, a terminal part PAD, a driving voltage supply line 11, and a common voltage supply line 13 may be arranged in the non-display area NDA.

The first scan driving circuit SDR1 may apply a scan signal, through a scan line SL, to the main pixel circuit PCm that drives the main subpixels Pm. Furthermore, the first scan driving circuit SDR1 may apply an emission control signal En to each pixel circuit through an emission control line EL. The second scan driving circuit SDR2 may be arranged symmetrical to the first scan driving circuit SDR1 with respect to the main display area MDA. Part of the main pixel circuit PCm of the main subpixels Pm in the main display area MDA may be electrically connected to the first scan driving circuit SDR1, and the other part thereof may be electrically connected to the second scan driving circuit SDR2.

The terminal part PAD may be arranged at one side of the substrate 100. The terminal part PAD that is not covered by an insulating layer may be exposed and connected to a display circuit board 30. A display driving portion 32 may be arranged on the display circuit board 30.

The display driving portion 32 may generate control signals that are transmitted to the first scan driving circuit SDR1 and the second scan driving circuit SDR2. The display driving portion 32 may generate a data signal, and the generated data signal may be transmitted to the main pixel circuit PCm through a fan-out wiring FW and a data line DL connected to the fan-out wiring FW.

The display driving portion 32 may supply a driving voltage ELVDD and a common voltage ELVSS to the driving voltage supply line 11 and the common voltage supply line 13, respectively. The driving voltage ELVDD may be applied to the pixel circuits of the subpixels Pm and Pa through a driving voltage line PL connected to the driving voltage supply line 11, and the common voltage ELVSS may be connected to the common voltage supply line 13 and applied to a counter electrode of the display element.

The driving voltage supply line 11 may extend in an X direction below the main display area MDA. The common voltage supply line 13 may have a loop shape with one open side, partially surrounding the main display area MDA.

Figure 5:
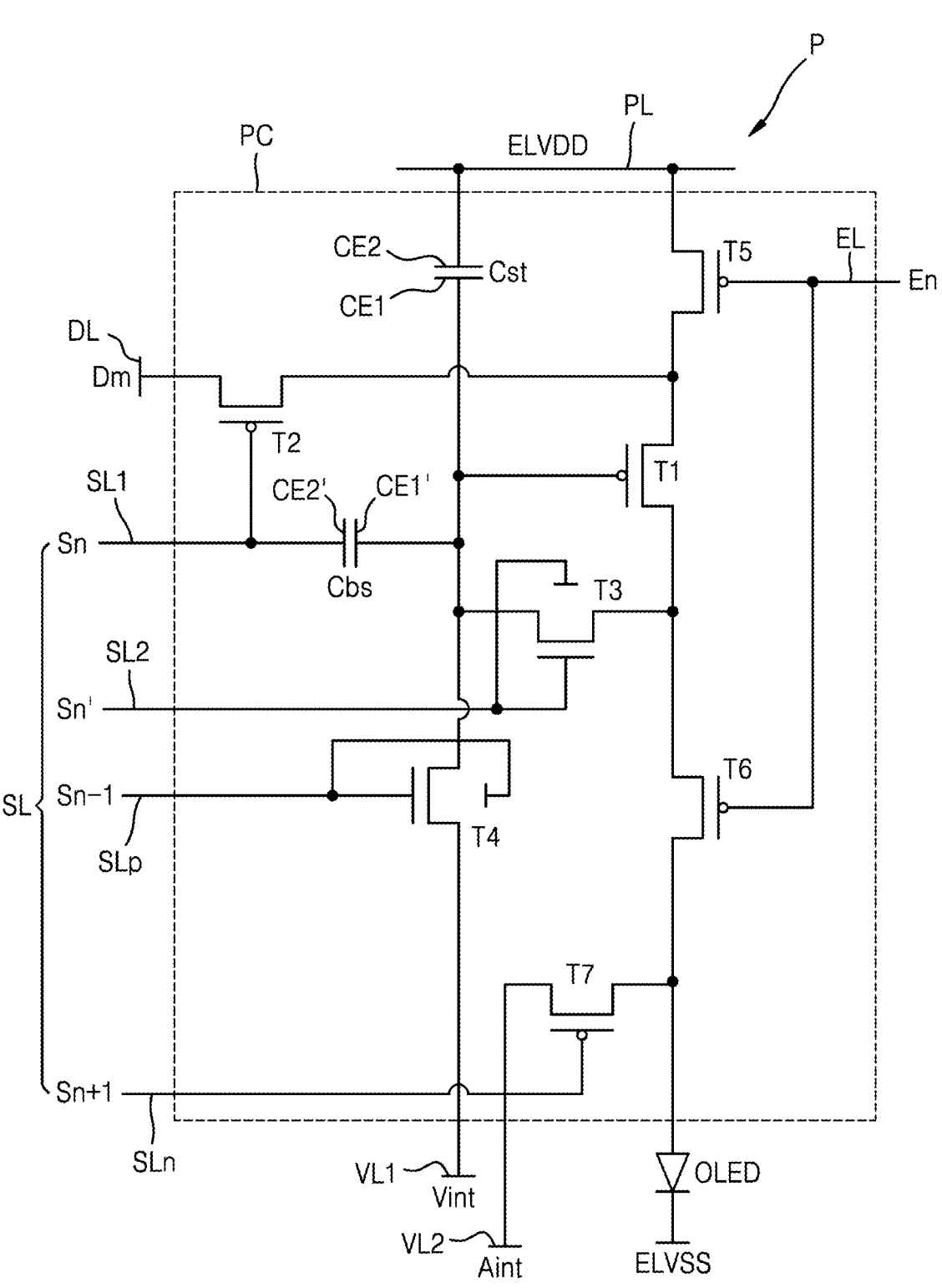
FIG. 5 is a schematic equivalent circuit diagram of an organic light-emitting diode and a pixel circuit connected thereto of a display apparatus according to one or more embodiments.

FIG. 5 is a schematic equivalent circuit diagram of the organic light-emitting diode OLED and a pixel circuit connected thereto in a display apparatus according to one or more embodiments.

In FIG. 5, a pixel circuit PC may be at least one of the main pixel circuit PCm, the first auxiliary pixel circuit PCa1, and the second auxiliary pixel circuit PCa2, which are described in FIG. 4.

In an example, the pixel circuit PC may include a plurality of thin film transistors T1 to T7 and a storage capacitor Cst. The thin film transistors T1 to T7 and the storage capacitor Cst may be connected to signal lines SL1, SL2, SLp, SLn, EL, and DL, a first initialization voltage line VL1, a second initialization voltage line VL2 (or, an anode initialization voltage line), and the driving voltage line PL. In an embodiment, at least any one, for example, the driving voltage line PL, of the above-described wirings may be shared by neighboring pixels P.

The thin film transistors T1 to T7 may include a driving thin film transistor T1, a switching thin film transistor T2, a compensation thin film transistor T3, a first initialization thin film transistor T4, an operation control thin film transistor T5, an emission control thin film transistor T6, and a second initialization thin film transistor T7.

The organic light-emitting diode OLED may include a first electrode, for example, an anode electrode, and a second electrode, for example, a cathode electrode, and the first electrode of the organic light-emitting diode OLED is connected to the driving thin film transistor T1 via the emission control thin film transistor T6 to receive a driving current, and the second electrode may receive a common voltage ELVSS. The organic light-emitting diode OLED may generate light having luminance corresponding to the driving current.

Some of the thin film transistors T1 to T7 may be provided as n-channel MOSFETs ("NMOSs"), and the other may be provided as p-channel MOSFETs ("PMOSs"). For example, among the thin film transistors T1 to T7, the compensation thin film transistor T3 and the first initialization thin film transistor T4 may be provided as NMOSs, and the other may be provided as PMOSs.

In another embodiment, among the thin film transistors T1 to T7, the compensation thin film transistor T3, the first initialization thin film transistor T4, and the second initialization thin film transistor T7 may be provided as NMOSs, and the other may be provided as PMOSs. Alternatively, among the thin film transistors T1 to T7, only one transistor may be provided as an NMOS, and the other may be provided as PMOSs. Alternatively, the thin film transistors T1 to T7 are all provided as NMOSs.

The signal lines may include a first scan line SL1 configured to deliver a first scan signal Sn, a second scan line SL2 configured to deliver a second scan signal Sn', a previous scan line SLp configured to deliver a previous scan signal Sn−1 to the first initialization thin film transistor T4, the emission control line EL configured to deliver the emission control signal En to the operation control thin film transistor T5 and the emission control thin film transistor T6, a next scan line SLn configured to deliver a next scan signal Sn+1 to the second initialization thin film transistor T7, and the data line DL crossing the first scan line SL1 and configured to deliver a data signal Dm.

The driving voltage line PL may be configured to deliver the driving voltage ELVDD to the driving thin film transistor T1, and the first initialization voltage line VL1 may be configured to deliver a first initialization voltage Vint that initializes the driving thin film transistor T1 and a pixel electrode of the organic light-emitting diode OLED.

A driving gate electrode of the driving thin film transistor T1 may be connected to the storage capacitor Cst, a driving source region of the driving thin film transistor T1 may be connected to the driving voltage line PL via the operation control thin film transistor T5, and a driving drain region of the driving thin film transistor T1 may be electrically connected to the pixel electrode of the organic light-emitting diode OLED via the emission control thin film transistor T6. According to a switching operation of the switching thin film transistor T2, the driving thin film transistor T1 may receive the data signal Dm and supply a driving current IDLED to the organic light-emitting diode OLED.

A switching gate electrode of the switching thin film transistor T2 may be connected to the first scan line SL1 configured to deliver the first scan signal Sn, a switching source region of the switching thin film transistor T2 may be connected to the data line DL, and a switching drain region of the switching thin film transistor T2 may be connected to the driving source region of the driving thin film transistor T1 and to the driving voltage line PL via the operation control thin film transistor T5. The switching thin film transistor T2 may be turned on in response to the first scan signal Sn received through the first scan line SL1 and may perform the switching operation of transmitting the data signal Dm delivered through the data line DL to the driving source region of the driving thin film transistor T1.

A compensation gate electrode of the compensation thin film transistor T3 may connected to the second scan line SL2. A compensation drain region of the compensation thin film transistor T3 may be connected to the driving drain region of the driving thin film transistor T1 and to the pixel electrode of the organic light-emitting diode OLED via the emission control thin film transistor T6. A compensation source region of the compensation thin film transistor T3 may be connected to a lower electrode CE1 of the storage capacitor Cst and the driving gate electrode of the driving thin film transistor T1. Furthermore, the compensation source region may be connected to a first initialization drain region of the first initialization thin film transistor T4.

The compensation thin film transistor T3 may be turned on in response to the second scan signal Sn' received through the second scan line SL2 and may diode-connect the driving thin film transistor T1 by electrically connecting the driving gate electrode of the driving thin film transistor T1 to the driving drain region of the driving thin film transistor T1.

A first initialization gate electrode of the first initialization thin film transistor T4 may be connected to the previous scan line SLp. A first initialization source region of the first initialization thin film transistor T4 may be connected to a second initialization source region of the second initialization thin film transistor T7 and the first initialization voltage line VL1. The first initialization drain region of the first initialization thin film transistor T4 may be connected to the lower electrode CE1 of the storage capacitor Cst, the compensation source region of the compensation thin film transistor T3, and the driving gate electrode of the driving thin film transistor T1. The first initialization thin film transistor T4 may be turned on in response to the previous scan signal Sn−1 received by the previous scan line SLp and may perform an initialization operation of transmitting the first initialization voltage Vint to the driving gate electrode of the driving thin film transistor T1 to initialize a voltage of the driving gate electrode of the driving thin film transistor T1.

An operation control gate electrode of the operation control thin film transistor T5 may be connected to the emission control line EL, and an operation control source region of the operation control thin film transistor T5 may be connected to the driving voltage line PL, and an operation control drain region of the operation control thin film transistor T5 may be connected to the driving source region of the driving thin film transistor T1 and the switching drain region of the switching thin film transistor T2.

An emission control gate electrode of the emission control thin film transistor T6 may be connected to the emission control line EL, an emission control source region of the emission control thin film transistor T6 may be connected to the driving drain region of the driving thin film transistor T1 and the compensation drain region of the compensation thin film transistor T3, and an emission control drain region of the emission control thin film transistor T6 may be electrically connected to a second initialization drain region of the second initialization thin film transistor T7 and the pixel electrode of the organic light-emitting diode OLED.

The operation control thin film transistor T5 and the emission control thin film transistor T6 may be simultaneously turned on in response to the emission control signal En received through the emission control line EL, and thus the driving voltage ELVDD is transmitted to the organic light-emitting diode OLED so that the driving current $I_{OLED}$ flows in the organic light-emitting diode OLED.

A second initialization gate electrode of the second initialization thin film transistor T7 may be connected to the next scan line SLn, the second initialization drain region of the second initialization thin film transistor T7 may be connected to the emission control drain region of the emission control thin film transistor T6 and the pixel electrode of the organic light-emitting diode OLED, and the second initialization source region of the second initialization thin film transistor T7 may be connected to the second initialization voltage line VL2, and may receive an anode initialization voltage Aint. The second initialization thin film transistor T7 may be turned on in response to the next scan signal Sn+1 received through the next scan line SLn to initialize the pixel electrode of the organic light-emitting diode OLED.

The second initialization thin film transistor T7 may be connected to the next scan line SLn, as illustrated in FIG. 2. In another embodiment, the second initialization thin film transistor T7 may be connected to the emission control line EL and driven in response to the emission control signal En. The positions of the source regions and the drain regions may be switched according to the type (p-type or n-type) of the transistors.

The storage capacitor Cst may include the lower electrode CE1 and an upper electrode CE2. The lower electrode CE1 of the storage capacitor Cst may be connected to the driving gate electrode of the driving thin film transistor T1, and the upper electrode CE2 of the storage capacitor Cst may be connected to the driving voltage line PL. The storage capacitor Cst may store electric charges corresponding to a difference between the driving gate electrode voltage of the driving thin film transistor T1 and the driving voltage ELVDD.

A boosting capacitor Cbs may include a first electrode CE1' and a second electrode CE2'. The first electrode CE1' of the boosting capacitor Cbs may be connected to the lower electrode CE1 of the storage capacitor Cst, and the second electrode CE2' of the boosting capacitor Cbs may receive a first scan signal Sn'. When the provision of the first scan signal Sn' is stopped, the boosting capacitor Cbs may increase the voltage of a gate terminal of the driving thin film transistor T1, thereby compensating for a voltage drop of the gate terminal.

An operation of each pixel P according to an embodiment is described below in detail.

During an initialization period, when the previous scan signal Sn−1 is supplied through the previous scan line SLp, the first initialization thin film transistor T4 is turned on in response to the previous scan signal Sn−1, and the driving thin film transistor T1 is initialized by the first initialization voltage Vint supplied through the first initialization voltage line VL1.

During a data programming period, when the first scan signal Sn and the second scan signal Sn' are supplied through the first scan line SL1 and the second scan line SL2, respectively, the switching thin film transistor T2 and the compensation thin film transistor T3 are turned on in response to the first scan signal Sn and the second scan signal Sn', respectively. In this state, the driving thin film transistor T1 is diode-connected by the compensation thin film transistor T3 that is turned on, and biased in a forward direction.

Then, a compensation voltage (Dm+Vth) obtained by subtracting a threshold voltage Vth of the driving thin film transistor T1, where Vth is a (−) value, from the data signal Dm supplied through the data line DL is applied to the driving gate electrode of the driving thin film transistor T1.

The driving voltage ELVDD and the compensation voltage (Dm+Vth) are applied to both ends of the storage capacitor Cst, and electric charges corresponding to a voltage difference between both ends of the storage capacitor Cst.

During an emission period, the operation control thin film transistor T5 and the emission control thin film transistor T6 are turned on in response to the emission control signal En supplied through the emission control line EL. The driving current IDLED according to a voltage difference between a voltage of the driving gate electrode of the driving thin film transistor T1 and the driving voltage ELVDD is generated, and the driving current IDLED is supplied to the organic light-emitting diode OLED via the emission control thin film transistor T6.

In the present embodiment, at least one of the thin film transistors T1 to T7 may include a semiconductor layer including an oxide, and the other may include a semiconductor layer including silicon.

In detail, in the case of the driving thin film transistor T1 that directly affects the brightness of a display apparatus, the driving thin film transistor T1 may include a semiconductor layer including polycrystalline silicon with high reliability, thereby implementing a high-resolution display apparatus.

As an oxide semiconductor has high carrier mobility and low leakage current, voltage drop is not much even when a driving time is long. In other words, even for low frequency driving, as a color change of an image due to a voltage drop is not much, low frequency driving is possible.

As such, as the oxide semiconductor has a merit of low leakage current, by employing, as an oxide semiconductor, at least one of the compensation thin film transistor T3, the first initialization thin film transistor T4, and the second initialization thin film transistor T7, which are connected to the driving gate electrode of the driving thin film transistor T1, a leakage current that flows toward the driving gate electrode may be effectively prevented and simultaneously power consumption may be effectively reduced.

Figure 6:
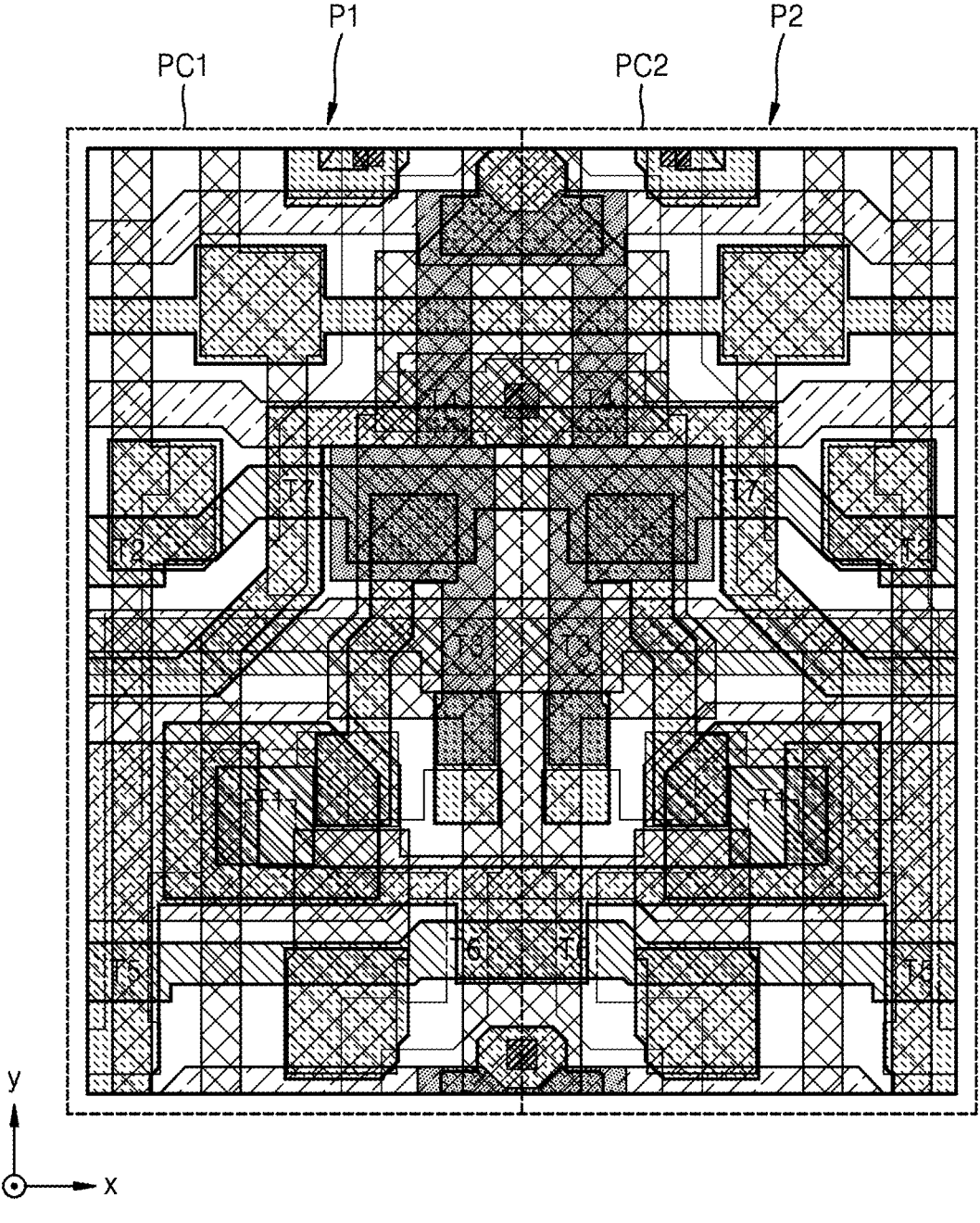
FIG. 6 is a schematic plan view of a structure of a pixel circuit according to one or more embodiments.

FIG. 6 is a schematic plan view of a structure of a pixel circuit according to one or more embodiments. FIGS. 7A to 7G are plan views of conductive patterns forming the pixel circuit of FIG. 6 that are illustrated by layers. FIG. 8 is a schematic cross-sectional view of portion of a structure of a pixel circuit according to one or more embodiments.

Referring to FIG. 6, the display apparatus 1 may include a first subpixel P1 and a second subpixel P2 that neighbor each other. In an embodiment, the first subpixel P1 and the second subpixel P2 may have a structure that is symmetrical with respect to an imaginary line. In another embodiment, the first subpixel P1 and the second subpixel P2 may have the same pixel structure that is continuously repeated, not a symmetrical structure. The first subpixel P1 may include a first pixel circuit PC1, and the second subpixel P2 may include a second pixel circuit PC2.

In the following description, for convenience of explanation, although some conductive patterns are described with respect to the first pixel circuit PC1, the conductive patterns are also provided symmetrical to the second pixel circuit PC2. Furthermore, the first subpixel P1 and the second subpixel P2, which are described below with reference to FIGS. 6 and 7A to 7G, may be at least one of the main subpixels Pm, the first auxiliary subpixel Pa1, and the second auxiliary subpixel Pa2, which are described above with reference to FIG. 4 or the like.

A buffer layer 111 (see FIG. 8) of the substrate 100 may be arranged on the substrate 100. The buffer layer 111 may prevent metal atoms or impurities from diffusing from the substrate 100 toward a first active pattern 1100. Furthermore, the buffer layer 111 may adjust a heat supply speed during a crystallization process to form the first active pattern 1100, thereby forming the first active pattern 1100 uniformly.

Figure 7A:
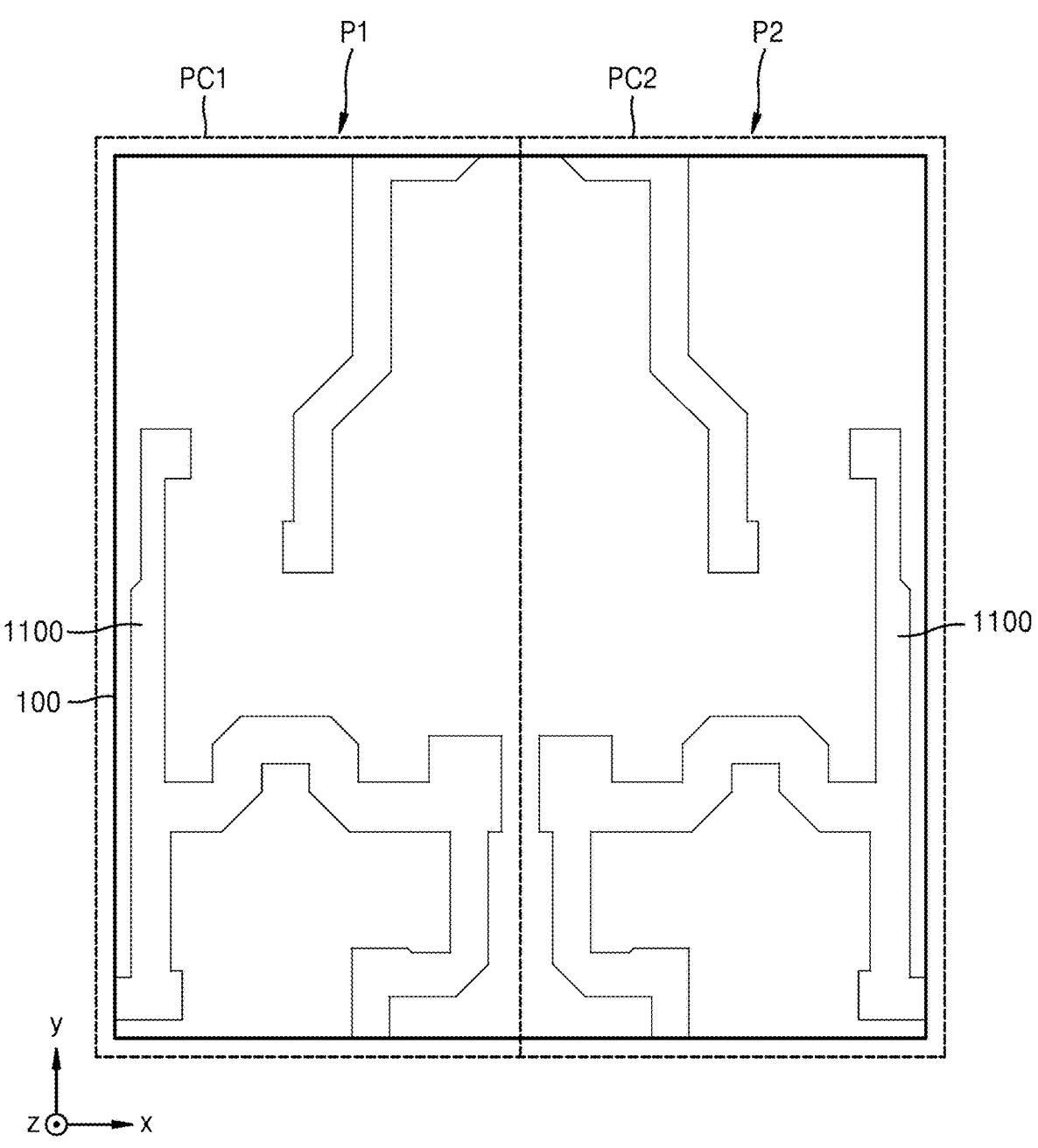
FIGS. 7A to 7G are plan views of conductive patterns forming the pixel circuit of FIG. 6 that are illustrated by layers.
Figure 8:
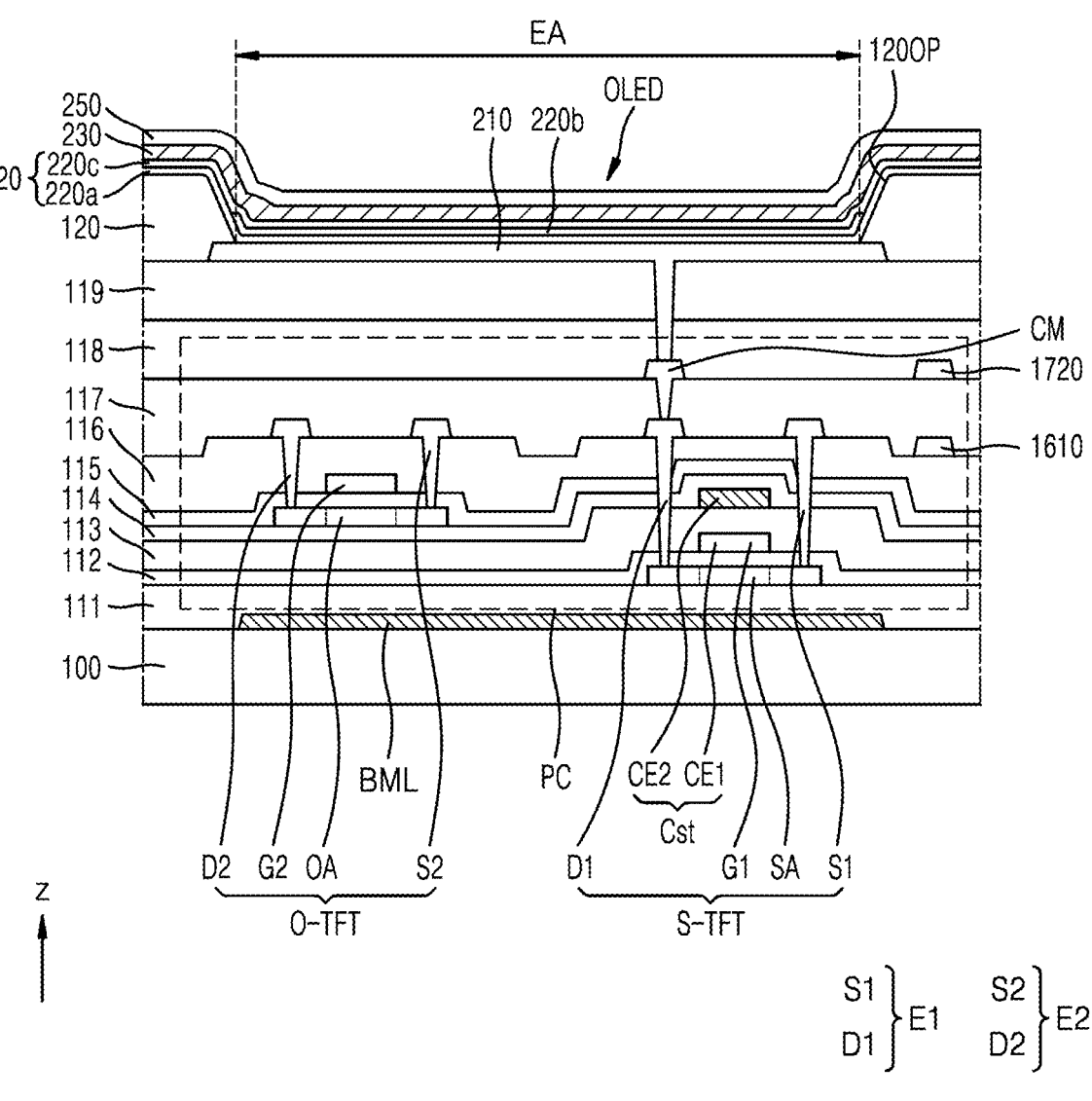
FIG. 8 is a schematic cross-sectional view of portion of a structure of a pixel circuit according to one or more embodiments.

As illustrated in FIG. 7A, the first active pattern 1100 may be arranged on the buffer layer 111. In an embodiment, the first active pattern 1100 may include a silicon semiconductor. For example, the silicon semiconductor may include amorphous silicon, polycrystalline silicon, or the like. For example, the first active pattern 1100 may include low-temperature poly silicon ("LTPS").

In an embodiment, ions may be injected into the first active pattern 1100. For example, when the driving thin film transistor T1, the switching thin film transistor T2, the operation control thin film transistor T5, the emission control thin film transistor T6, and the second initialization thin film transistor T7 are the PMOS transistors, ions such as boron or the like may be injected into the first active pattern 1100.

A first gate insulating layer 112 (see FIG. 8) may be arranged on the substrate 100, covering the first active pattern 1100. The first gate insulating layer 112 may include an insulating material. For example, the first gate insulating layer 112 may include silicon oxide, silicon nitride, silicon oxynitride, aluminum oxide, or the like.

Figure 7B:
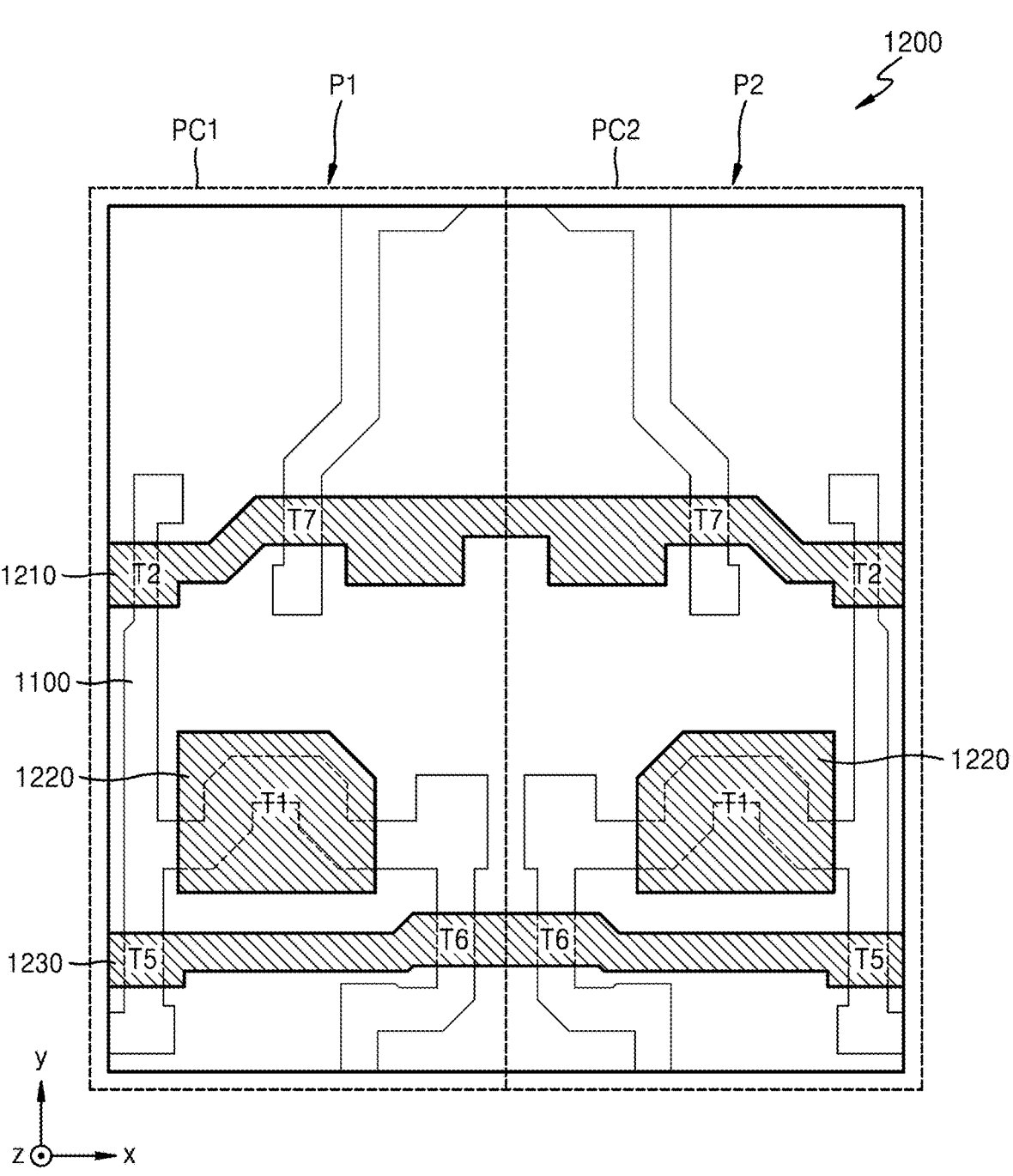

As illustrated in FIG. 7B, a first conductive pattern 1200 may be formed on the first gate insulating layer 112. The first conductive pattern 1200 may include a metal, an alloy, a conductive metal oxide, a transparent conductive material, or the like. For example, the first conductive pattern 1200 may include silver (Ag), an alloy including Ag, molybdenum (Mo), an alloy including Mo, aluminum (Al), an alloy including Al, aluminum nitride (AlN), tungsten (W), tungsten nitride (WN), copper (Cu), indium tin oxide ("ITO"), indium zinc oxide ("IZO"), or the like.

The first conductive pattern 1200 may include a first gate wiring 1210, a first gate electrode 1220, and a second gate wiring 1230.

The first gate wiring 1210 may extend in the X direction. The first gate wiring 1210 may correspond to the first scan line SL1 of FIG. 5. The first gate wiring 1210 may constitute, with the first active pattern 1100, the switching thin film transistor T2. For example, the first scan signal Sn may be provided as the first gate wiring 1210. Furthermore, the first gate wiring 1210 may constitute, with the first active pattern 1100, the second initialization thin film transistor T7. For example, the next scan signal Sn+1 may be provided as the first gate wiring 1210. The first scan signal Sn and the next scan signal Sn+1 may have substantially the same waveform with a time difference.

The first gate electrode 1220 may be arranged in an island shape. The first gate electrode 1220 may constitute, with the first active pattern 1100, the driving thin film transistor T1.

The second gate wiring 1230 may extend in the X direction. The second gate wiring 1230 may correspond to the emission control line EL of FIG. 5. The second gate wiring 1230 may constitute, with the first active pattern 1100, the operation control and emission control thin film transistors T5 and T6. For example, the emission control signal En may be supplied to the second gate wiring 1230.

A second gate insulating layer 113 (see FIG. 8) may be arranged on the first gate insulating layer 112, covering the first conductive pattern 1200. The second gate insulating layer 113 may include an insulating material such as the first gate insulating layer 112.

Figure 7C:
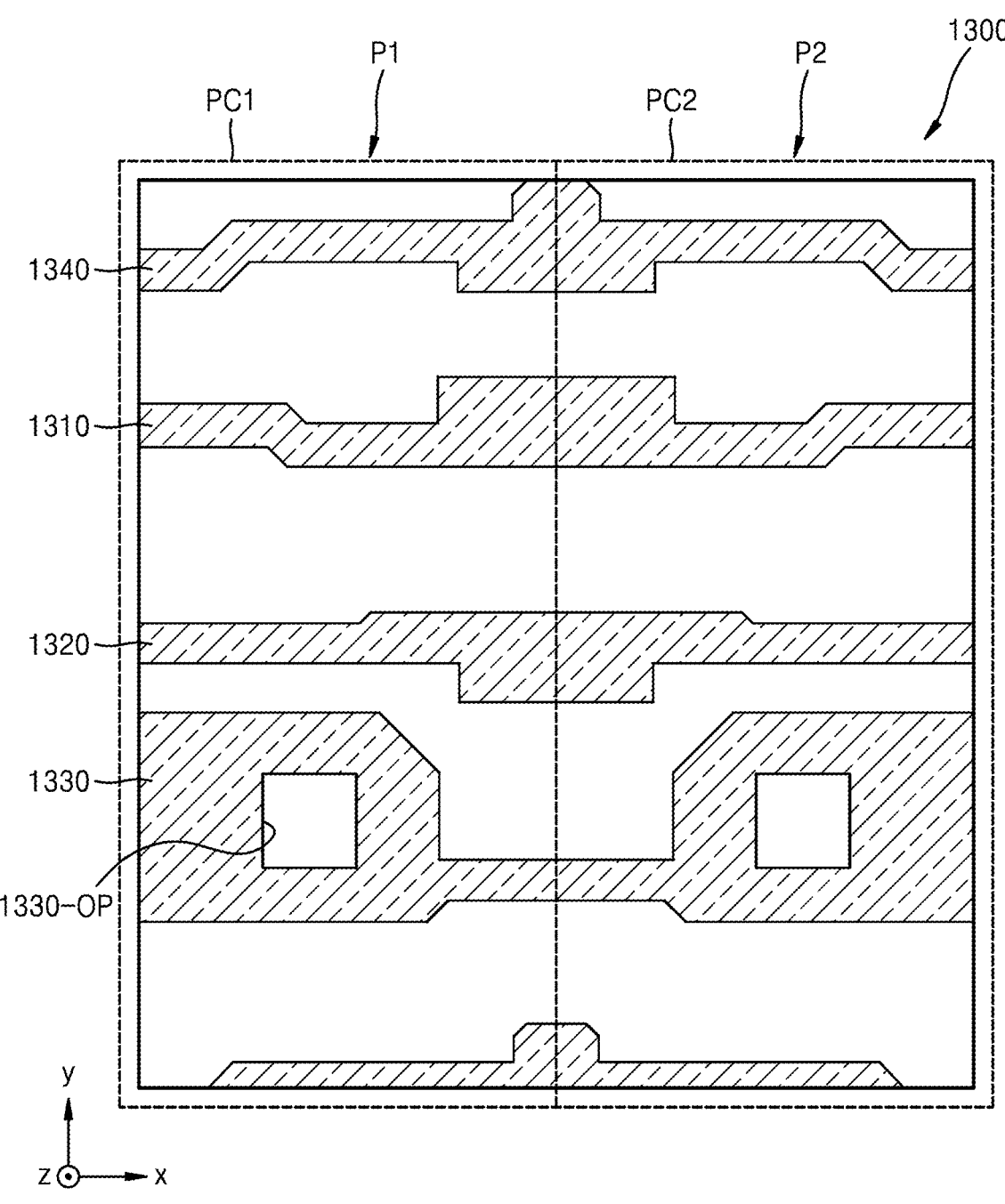

As illustrated in FIG. 7C, a second conductive pattern 1300 may be arranged on the second gate insulating layer 113. The second conductive pattern 1300 may include, for example, a metal, an alloy, a conductive metal oxide, a transparent conductive material, or the like.

The second conductive pattern 1300 may include a third gate wiring 1310, a fourth gate wiring 1320, a storage capacitor electrode 1330, that is, the upper electrode CE2 of FIG. 5, and a first initialization voltage line 1340, that is, the first initialization voltage line VL1 of FIG. 5.

The third gate wiring 1310 may extend in the X direction. The third gate wiring 1310 may correspond to the previous scan line SLp of FIG. 5. The third gate wiring 1310, when viewed in a plane, may be spaced apart from the first gate wiring 1210. The previous scan signal Sn-1 may be provided to the third gate wiring 1310.

The fourth gate wiring 1320 may extend in the X direction. The fourth gate wiring 1320 may correspond to the second scan line SL2 of FIG. 5. The fourth gate wiring 1320, when viewed in a plane, may be spaced apart from the first gate wiring 1210 and the third gate wiring 1310. The second scan signal Sn' may be provided to the fourth gate wiring 1320.

The storage capacitor electrode 1330 may overlap the first gate electrode 1220 in the plan view and extend in the X direction. For example, the storage capacitor electrode 1330 may constitute the storage capacitor Cst with the first gate electrode 1220. The driving voltage ELVDD may be provided to the storage capacitor electrode 1330. Furthermore, a hole 1330-OP that penetrates the storage capacitor electrode 1330 may be formed in the storage capacitor electrode 1330, and the first gate electrode 1220 may be exposed through the hole 1330-OP.

The first initialization voltage line 1340 may extend in the X direction. The first initialization voltage line 1340, when viewed in a plane, may be spaced apart from the third gate wiring 1310. The first initialization voltage Vint may be provided through the first initialization voltage line 1340. The first initialization voltage line 1340 may at least partially overlap a second active pattern 1400 that is described below in the plan view, and may be configured to deliver the first initialization voltage Vint to the second active pattern 1400. The first initialization voltage line 1340 may be electrically connected to the second active pattern 1400 via contact portions 1680CNT1, 1680CNT2, and 1680CNT3 that are described below with reference to FIG. 7F. The first initialization voltage line 1340 may be the first initialization voltage line VL1 of FIG. 5.

A first interlayer insulating layer 114 (see FIG. 8) may cover the second conductive pattern 1300, and may be arranged on the second gate insulating layer 113. The first interlayer insulating layer 114 may include an insulating material. For example, the first interlayer insulating layer 114 may include silicon oxide, silicon nitride, silicon oxynitride, aluminum oxide, or the like.

Figure 7D:
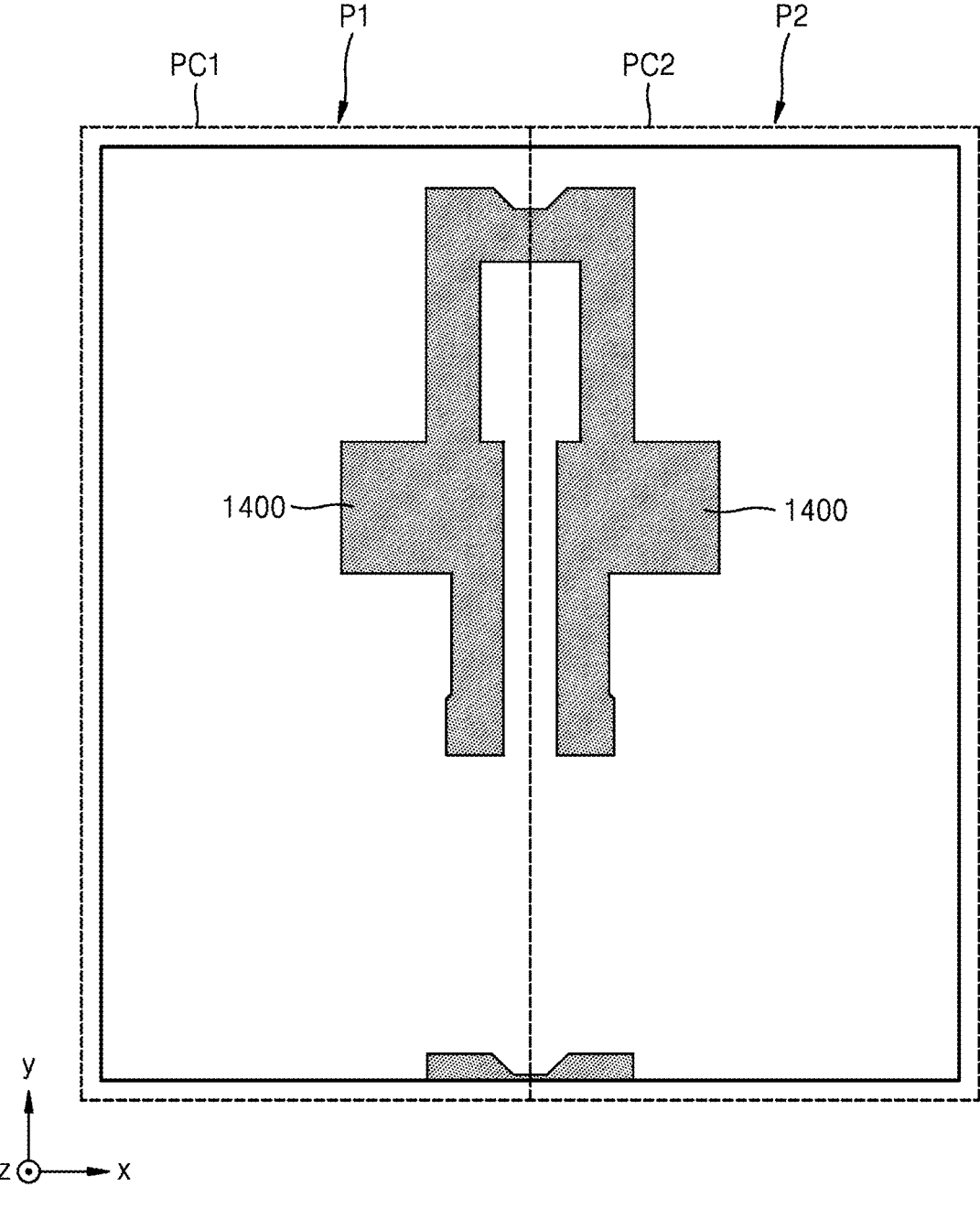

As illustrated in FIG. 7D, the second active pattern 1400 may be arranged on the first interlayer insulating layer 114. In the present embodiment, the second active pattern 1400 may include an oxide semiconductor. The second active pattern 1400 may be arranged in a layer different from the first active pattern 1100, not overlapping the first active pattern 1100 in the plan view.

A second interlayer insulating layer 115 (see FIG. 8) may cover the second active pattern 1400, and may be arranged on the first interlayer insulating layer 114. The second interlayer insulating layer 115 may include an insulating material.

In an embodiment, as illustrated in FIG. 8, the second interlayer insulating layer 115 may be patterned to cover part of the second active pattern 1400 and expose the other part thereof. In this state, the second interlayer insulating layer 115 may be formed in the same pattern as a second gate electrode 1520 that is described below with reference to FIG. 7E. Accordingly, the second active pattern 1400 may expose a source region and a drain region, except a channel region that overlaps the second gate electrode 1520 in the plan view. The source region and the drain region may be in direct contact with a third interlayer insulating layer 116, as illustrated in FIG. 8.

Figure 7E:
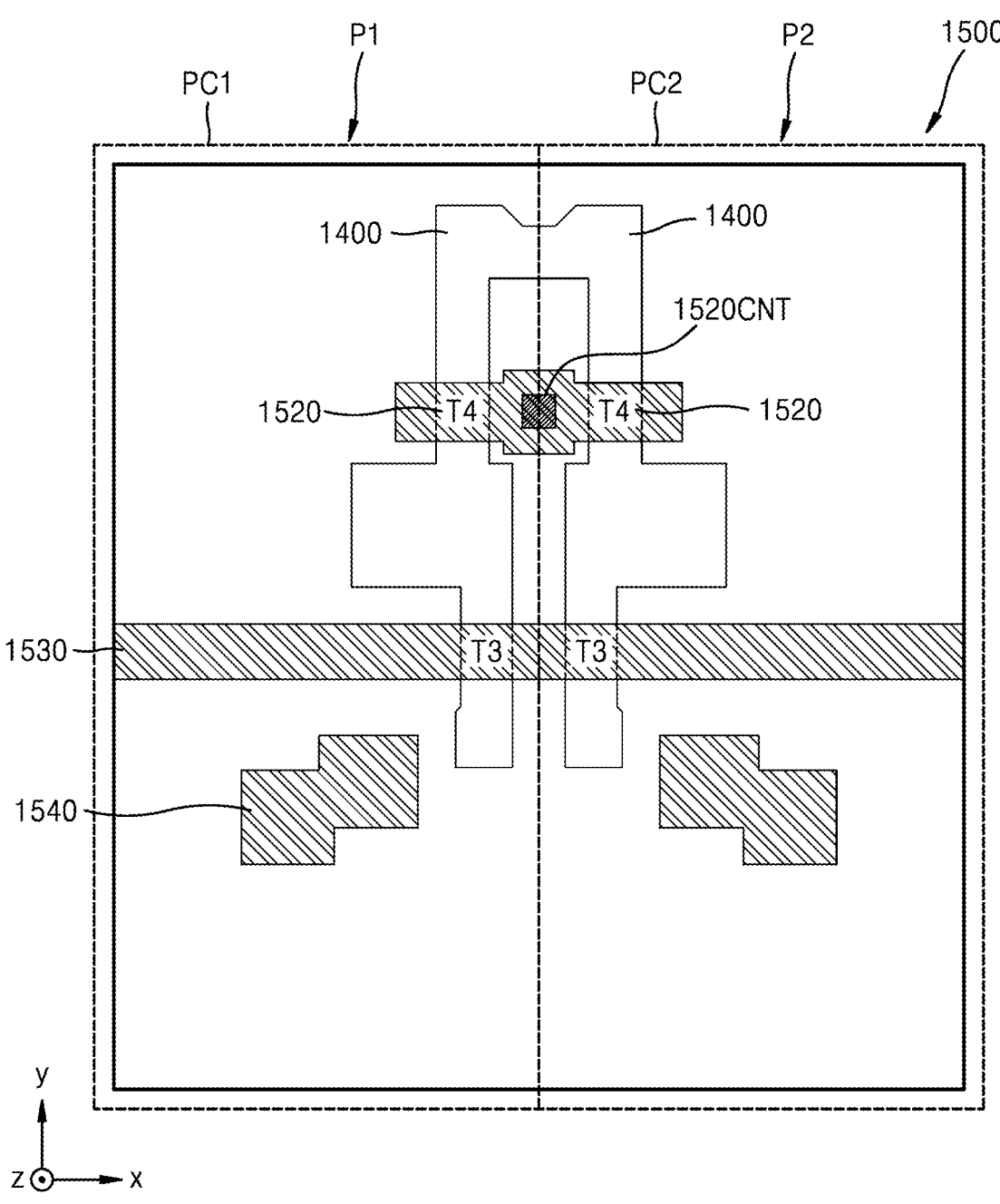

As illustrated in FIG. 7E, a third conductive pattern 1500 may be arranged on the second interlayer insulating layer 115. The third conductive pattern 1500 may include, for example, a metal, an alloy, a conductive metal oxide, a transparent conductive material, or the like.

The third conductive pattern 1500 may include the second gate electrode 1520, a fifth gate wiring 1530, and a first transmission pattern 1540.

The second gate electrode 1520 may overlap the third gate wiring 1310 and the second active pattern 1400 in the plan view. In the present embodiment, the second gate electrode 1520 may be electrically connected to the third gate wiring 1310. For example, the second gate electrode 1520 may be in contact with the third gate wiring 1310 via a contact portion 1520CNT. The contact portion 1520CNT may be formed by a contact hole that penetrates insulating layers, for example, the first interlayer insulating layer 114 and the second interlayer insulating layer 115, provided between the third gate wiring 1310 and the second gate electrode 1520.

The second scan signal Sn' may be provided to the second gate electrode 1520. The third gate wiring 1310, the second active pattern 1400, and the second gate electrode 1520 may constitute the first initialization thin film transistor T4. For example, the third gate wiring 1310 may correspond to a back-gate electrode of the first initialization thin film transistor T4, and the second gate electrode 1520 may correspond to the gate electrode of the first initialization thin film transistor T4.

The fifth gate wiring 1530 may extend in the X direction. The fifth gate wiring 1530 may overlap the fourth gate wiring 1320 and the second active pattern 1400 in the plan view. In some embodiments, the fifth gate wiring 1530 may be electrically connected to the fourth gate wiring 1320. For example, the fifth gate wiring 1530 may be in contact with the fourth gate wiring 1320 via a contact.

The second scan signal Sn' may be provided to the fifth gate wiring 1530. The fourth gate wiring 1320, the second active pattern 1400, and the fifth gate wiring 1530 may constitute the compensation thin film transistor T3. For example, the fourth gate wiring 1320 may correspond to a back-gate electrode of the compensation thin film transistor T3, and the fifth gate wiring 1530 may correspond to the gate electrode of the compensation thin film transistor T3.

The first transmission pattern 1540 may be in contact with the first gate electrode 1220 that is exposed through the hole 1330-OP of the storage capacitor electrode 1330. The first transmission pattern 1540 may transmit the initialization voltage Vint to the first gate electrode 1220.

The third interlayer insulating layer 116, as illustrated in FIG. 8, may be arranged to cover at least part of the third conductive pattern 1500. The third interlayer insulating layer 116 may include an insulating material. For example, the third interlayer insulating layer 116 may include silicon oxide, silicon nitride, silicon oxynitride, aluminum oxide, or the like.

Figure 7F:
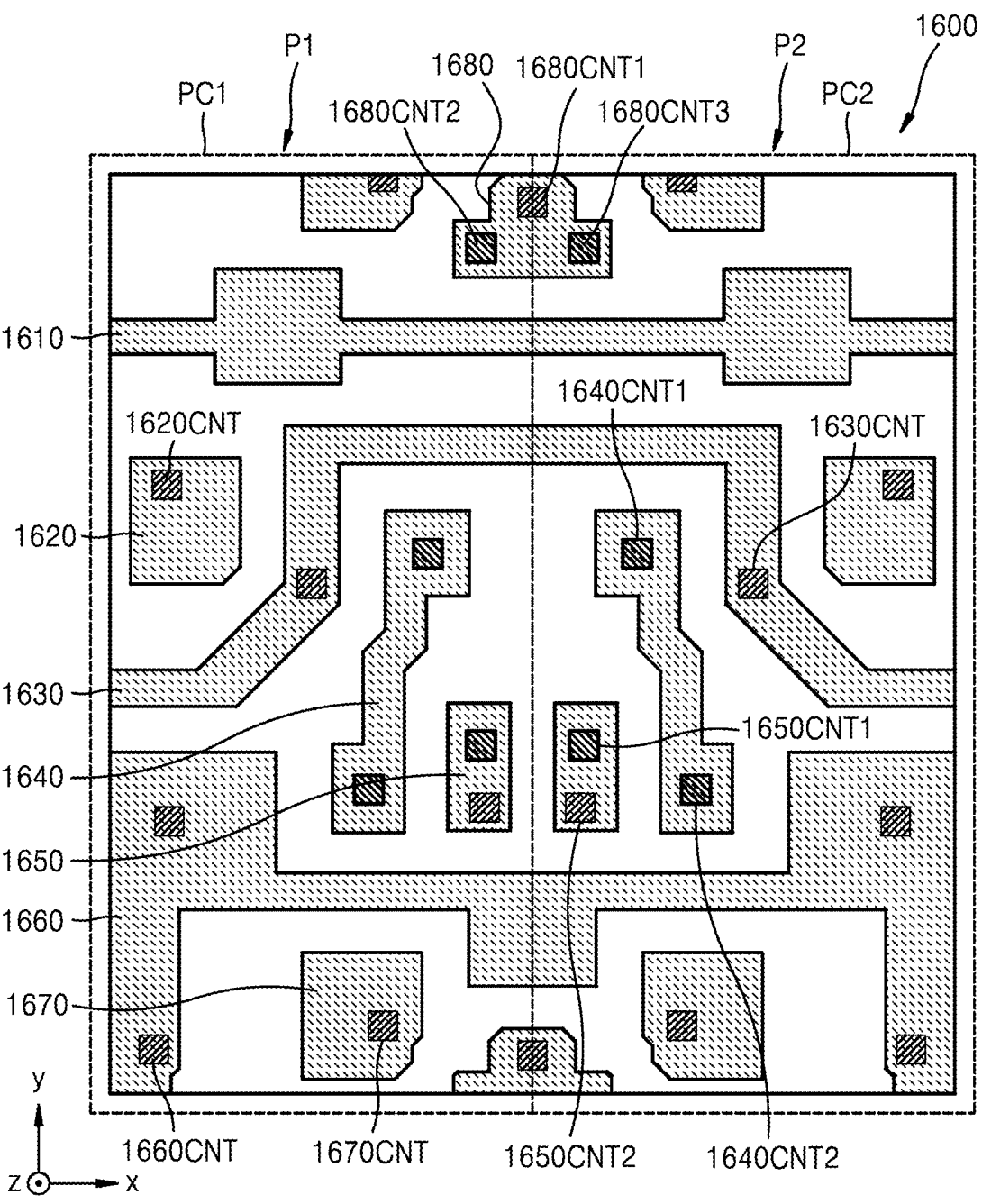

As illustrated in FIG. 7F, a fourth conductive pattern 1600 may be arranged on the third interlayer insulating layer 116. The fourth conductive pattern 1600 may include, for example, a metal, an alloy, a conductive metal oxide, a transparent conductive material, or the like.

The fourth conductive pattern 1600 may include a first signal transmission line 1610, a second transmission pattern 1620, a second initialization voltage line 1630, a third transmission pattern 1640, a fourth transmission pattern 1650, a fifth transmission pattern 1660, and a sixth transmission pattern 1670.

The first signal transmission line 1610 may extend in the X direction. The data signal Dm may be provided through the first signal transmission line 1610.

The second transmission pattern 1620 may be in contact with the first active pattern 1100 through a contact portion 1620CNT. The data signal Dm may be transmitted to the first active pattern 1100 through the second transmission pattern 1620.

The second initialization voltage line 1630, that is, the second initialization voltage line VL2 of FIG. 5, may extend in the X direction. A second initialization voltage Aint may be provided to the second initialization voltage line 1630. The second initialization voltage line 1630 may be in contact with the first active pattern 1100 through a contact portion 1630CNT, and may transmit the second initialization voltage Aint to the first active pattern 1100.

The third transmission pattern 1640 may be in contact with the second active pattern 1400 and the first transmission pattern 1540 through contact portions 1640CNT1 and 1640CNT2 that are formed at one side and the other side (i.e., opposite side) of the third transmission pattern 1640, respectively. The first initialization voltage Vint may be transmitted to the first gate electrode 1220 through the second active pattern 1400, the third transmission pattern 1640, and the first transmission pattern 1540.

The fourth transmission pattern 1650 may be in contact with the second active pattern 1400 and the first active pattern 1100 through contact portions 1650CNT1 and 1650CNT2 that are formed in one side and the other side (i.e., opposite side) of the fourth transmission pattern 1650, respectively. The fourth transmission pattern 1650 may electrically connect the second active pattern 1400 to the first active pattern 1100.

The fifth transmission pattern 1660 may extend in the X direction. The driving voltage ELVDD may be provided to the fifth transmission pattern 1660. The fifth transmission pattern 1660 may be in contact with the first active pattern 1100 through a contact portion 1660CNT, and may transmit the driving voltage ELVDD to the first active pattern 1100.

The sixth transmission pattern 1670 may be in contact with the first active pattern 1100 through a contact portion 1670CNT. The sixth transmission pattern 1670 may transmit the driving current or the second initialization voltage Aint from the first active pattern 1100 to the organic light-emitting diode OLED.

A seventh transmission pattern 1680 may be in contact with the second active pattern 1400 through the contact portions 1680CNT1, 1680CNT2, and 1680CNT3. The seventh transmission pattern 1680 may be in contact with the first initialization voltage line 1340 of FIG. 7C through a contact portion 1680CNT1, and in contact with the second active pattern 1400 of FIG. 7D through the contact portions 1680CNT2 and 1680CNT3, so as to transmit the first initialization voltage Vint to the first initialization thin film transistor T4.

A first organic insulating layer 117 (see FIG. 8) may cover the fourth conductive pattern 1600, and may be arranged on the third interlayer insulating layer 116.

Figure 7G:
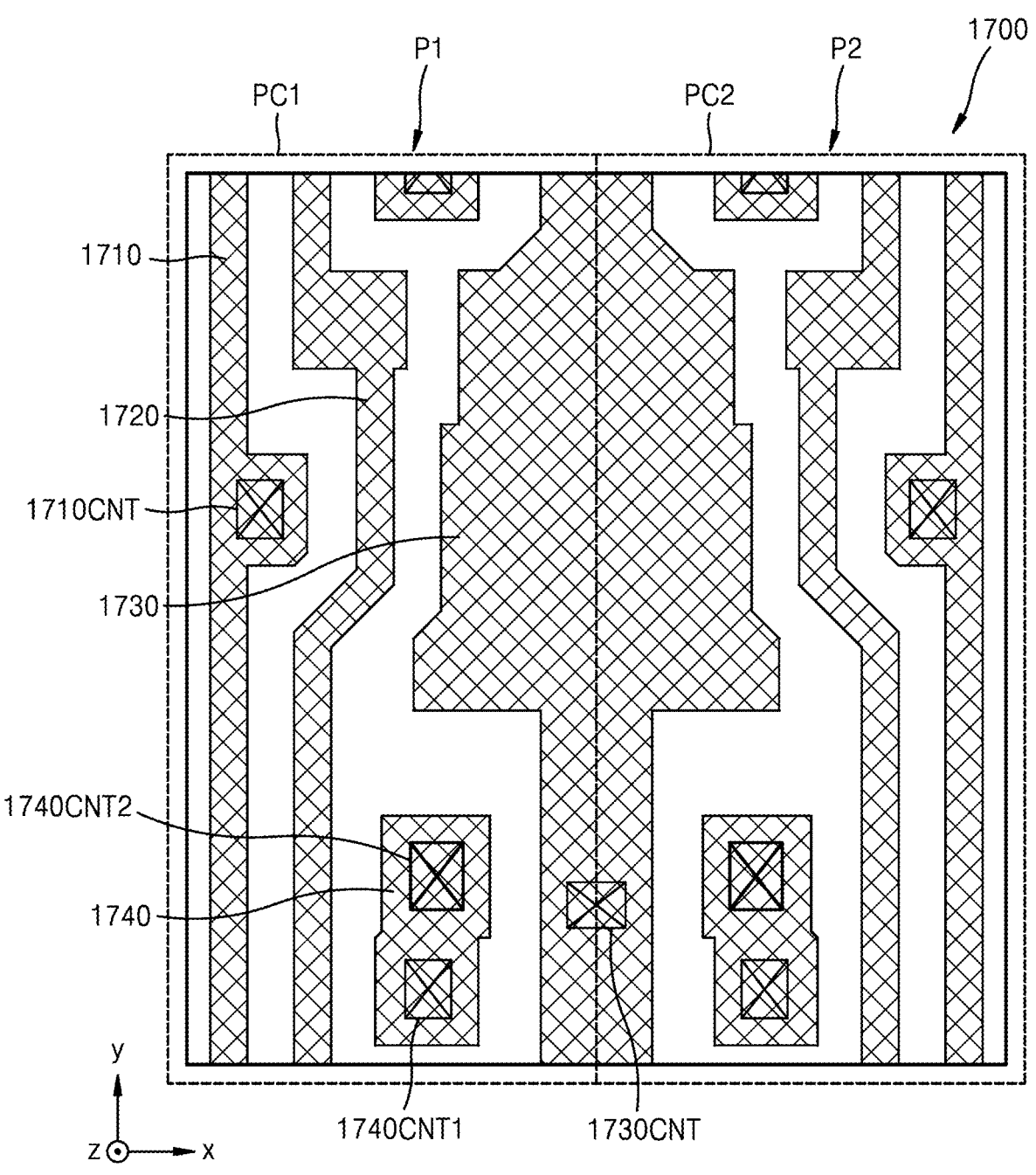

As illustrated in FIG. 7G, a fifth conductive pattern 1700 may be arranged on the first organic insulating layer 117. The fifth conductive pattern 1700 may include a data wiring 1710, a second signal transmission line 1720, a voltage wiring 1730, and an eighth transmission pattern 1740.

The data wiring 1710 may extend in a Y direction. The data wiring 1710 may correspond to the data line DL of FIG. 5. The data wiring 1710 may be connected to the second transmission pattern 1620 through a contact portion 1710CNT. The data signal Dm may be transmitted to the first active pattern 1100 through the data wiring 1710 and the second transmission pattern 1620.

The second signal transmission line 1720 may extend in the Y direction. The second signal transmission line 1720 may be in contact with the first signal transmission line 1610 so that the data signal Dm may be provided.

For example, different data voltages may be provided through the data wiring 1710 and the second signal transmission line 1720. In detail, a first data voltage may be transmitted to the first active pattern 1100 through the data wiring 1710, and a second data voltage that is different from the first data voltage may be transmitted to the first signal transmission line 1610 through the second signal transmission line 1720.

The voltage wiring 1730 may extend in the Y direction. The voltage wiring 1730 may correspond to the driving voltage line PL of FIG. 5. The voltage wiring 1730 may provide the driving voltage ELVDD. The voltage wiring 1730 may be connected to the fifth transmission pattern 1660 through a contact portion 1730CNT, and may provide the driving voltage ELVDD to the storage capacitor electrode 1330 and the operation control thin film transistor T5.

The voltage wiring 1730 may be shared by the first pixel circuit PC1 and the second pixel circuit PC2 that are adjacent to each other. In another embodiment, the voltage wiring 1730 may be provided in each of the first pixel circuit PC1 and the second pixel circuit PC2.

The eighth transmission pattern 1740 may be in contact with the sixth transmission pattern 1670 through a contact portion 1740CNT1. The eighth transmission pattern 1740 may transmit the driving current IDLED or the anode initialization voltage Aint from the sixth transmission pattern 1670 to the organic light-emitting diode OLED.

Furthermore, the eighth transmission pattern 1740 may be in contact with a pixel electrode 210 (see FIG. 8) through a contact portion 1740CNT2. The emission control thin film transistor T6 may be electrically connected to the pixel electrode 210 through the eighth transmission pattern 1740.

A stack structure on the fifth conductive pattern 1700 is described with reference to FIG. 8. A second organic insulating layer 118 may be arranged to cover a fifth conductive pattern 1700. A third organic insulating layer 119 may be arranged on the second organic insulating layer 118. A first organic insulating layer 117 to the third organic insulating layer 119 may include, for example, general purpose polymers such as benzocyclobutene ("BCB"), polyimide, hexamethyldisiloxane ("HMDSO"), polymethylmethacrylate ("PMMA"), or polystyrene ("PS"), polymer derivatives having phenolic groups, acrylic polymers, imide-based polymers, arylether-based polymers, amide-based polymers, fluorine-based polymers, p-xylene-based polymers, vinyl alcohol-based polymers, blends thereof, or the like.

The organic light-emitting diode OLED is arranged, as a display element, on the second organic insulating layer 118. The organic light-emitting diode OLED may include a pixel electrode 210, an intermediate layer 220 including an organic emission layer and a counter electrode 230.

The pixel electrode 210 may be a (semi-)transmissive electrode or a reflective electrode. In an embodiment, the pixel electrode 210 may include a reflective layer including Ag, Mg, Al, Pt, Pd, Au, Ni, Nd, Ir, Cr, a compound thereof, or the like, and a transparent or semi-transparent electrode layer formed on the reflective layer. The transparent or semi-transparent electrode layer may include at least one selected from the group consisting of ITO, IZO, zinc oxide (ZnO), indium oxide (In$_2$O$_3$), indium gallium oxide ("IGO"), and aluminum zinc oxide ("AZO"). For example, the pixel electrode 210 may include ITO/Ag/ITO.

A pixel defining layer 120 may be arranged on the third organic insulating layer 119. As the pixel defining layer 120 increases a distance between an edge of the pixel electrode 210 and the counter electrode 230 above the pixel electrode 210, generation of ark or the like at the edge of the pixel electrode 210 may be prevented.

The pixel defining layer 120 may include one or more organic insulating material selected from the group consisting of polyimide, polyamide, acryl resin, benzocyclobutene, and phenol resin, by a method such as spin coating and the like.

The intermediate layer 220 of the organic light-emitting diode OLED may be arranged in an opening 1200P formed by the pixel defining layer 120. An emission area EA of the organic light-emitting diode OLED may be defined by the opening 1200P.

The intermediate layer 220 may include an organic emission layer 220b. The organic emission layer 220b may include an organic material including a fluorescent or phosphorescent material that emits red, green, blue, or white light. The organic emission layer 220b may include a low molecular weight organic material or a polymer organic material, and a first functional layer 220a including a hole transport layer ("HTL") and a hole injection layer ("HIL"), and a second functional layer 220c including an electron transport layer ("ETL") and an electron injection layer ("EIL") may be further optionally arranged below or above the organic emission layer 220b.

The counter electrode 230 may be a transmissive electrode or a reflective electrode. In some embodiments, the counter electrode 230 may be a transparent or semi-transparent electrode, and may be formed by a metal thin film with a relatively small work function including Li, Ca, LiF/Ca, LiF/AI, Al, Ag, Mg, and a compound thereof. Furthermore, a transparent conductive oxide ("TCO") film such as ITO, IZO, ZnO or In$_2$O$_3$, or the like may be further arranged on the metal thin film. The counter electrode 230 may be integrally formed over the entire surface of the display area DA, and arranged above the intermediate layer 220 and the pixel defining layer 120.

An upper layer 250 including an organic material may be formed on the counter electrode 230. The upper layer 250 may be provided to protect the counter electrode 230 and simultaneously increase light extraction efficiency. The upper layer 250 may include an organic material with a refractive index higher than a refractive index of the counter electrode 230. Alternatively, the upper layer 250 may be provided by stacking layers with different refractive indexes. For example, the upper layer 250 may be provided by sacking a high refractive index layer/a low refractive index layer/a high refractive index layer. In this state, the refractive index of the high refractive index layer may be 1.7 or more, and the refractive index of the low refractive index layer may be 1.3 or more.

The upper layer 250 may additionally include LiF. Alternatively, the upper layer 250 may additionally include an inorganic insulating material such as silicon oxide (SiO$_2$) or silicon nitride (SiN$_x$).

The above-described active patterns 1100 and 1400 and conductive patterns 1200, 1300, 1500, 1600, and 1700 of FIG. 7A to FIG. 7G may constitute a silicon thin film transistor S-TFT and an oxide thin film transistor O-TFT, as illustrated in FIG. 8. The silicon thin film transistor S-TFT and the oxide thin film transistor O-TFT of FIG. 8 may be one of the above-described thin film transistors T1 to T7 of FIG. 5.

The silicon thin film transistor S-TFT may include a first electrode layer E1 that includes a silicon semiconductor layer SA, a first gate electrode G1, a source electrode S1, and a drain electrode Dl. The silicon semiconductor layer SA may correspond to part of the first active pattern 1100 of FIG. 7A, the first gate electrode G1 may correspond to part of the first conductive pattern 1200 of FIG. 7B, and the first electrode layer E1 may correspond to part of the fourth conductive pattern 1600 of FIG. 7F. The first electrode layer E1 may be connected to the pixel electrode 210 via a contact metal CM.

The upper electrode CE2 is arranged above the first gate electrode G1, and may constitute a storage capacitor Cst with the lower electrode CE1 that is integrated with the first gate electrode G1.

The oxide thin film transistor O-TFT may include a second electrode layer E2 that includes an oxide semiconductor layer OA, a second gate electrode G2, a source electrode S2, and a drain electrode D2. The oxide semiconductor layer OA may correspond to part of the second active pattern 1400 of FIG. 7D, the second gate electrode G2 may correspond to part of the third conductive pattern 1500 of FIG. 7E, and the second electrode layer E2 may correspond to the fourth conductive pattern 1600 of FIG. 7F.

Figure 9:
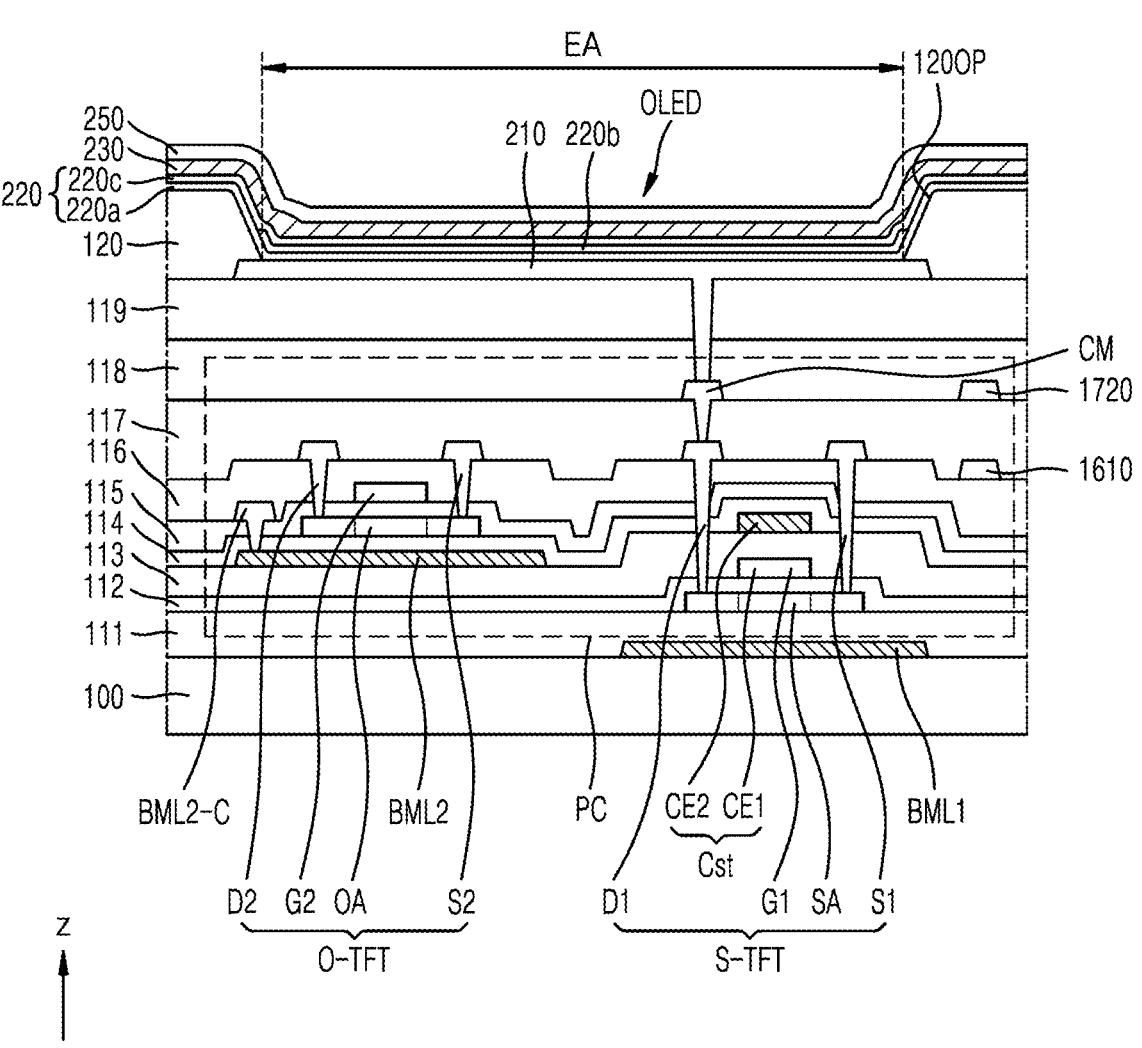
FIG. 9 is a schematic cross-sectional view of portion of a structure of a pixel circuit according to one or more embodiments.

FIG. 9 is a schematic cross-sectional view of part of a structure of a pixel circuit according to one or more embodiments.

In another embodiment, although the cross-sectional structure of FIG. 9 is similar to the above-described structure of FIG. 8, the cross-sectional structure of FIG. 9 may further include a first bottom metal layer BML1 and a second bottom metal layer BML2 arranged below the thin film transistors S-TFT and O-TFT, respectively.

The first bottom metal layer BML1 may be arranged to correspond to at least a partial area of the pixel circuit PC. In an embodiment, the first bottom metal layer BML1 may be arranged to overlap the driving thin film transistor T1 (see FIG. 5) that is provided as the silicon thin film transistor S-TFT in the plan view.

The first bottom metal layer BML1 may be provided between the substrate 100 and the buffer layer 111. In an embodiment, the first bottom metal layer BML1 may be arranged on the substrate 100 in which an organic film and an inorganic film are alternately stacked, and an inorganic barrier layer may be further provided between the first bottom metal layer BML1 and the buffer layer 111. The first bottom metal layer BML1 may be connected to an electrode or a wiring, and may receive a constant voltage or signal therefrom. In another embodiment, the first bottom metal layer BML1 may be provided in the form of being isolated form other electrode or wiring.

The second bottom metal layer BML2 may be arranged to correspond to a lower portion of the oxide thin film transistor O-TFT. The second bottom metal layer BML2 may be provided between the second gate insulating layer 113 and a first interlayer insulating layer 114. The second bottom metal layer BML2 may be arranged on the same layer as the upper electrode CE2 of the storage capacitor Cst. The second bottom metal layer BML2 may be connected to a contact electrode BML2-C, and may receive a constant voltage or signal. The contact electrode BML2-C may be arranged on the same layer as the second gate electrode G2 of the oxide thin film transistor O-TFT.

The first bottom metal layer BML1 and the second bottom metal layer BML2 may be formed of a reflective metal, and may include, for example, Ag, an alloy including Ag, Mo, an alloy including Mo, Al, an alloy including Al, AlN, W, WN, Cu, ITO, IZO, p+doped amorphous silicon, or the like. The first bottom metal layer BML1 and the second bottom metal layer BML2 may the same material or different materials.

Figure 10:
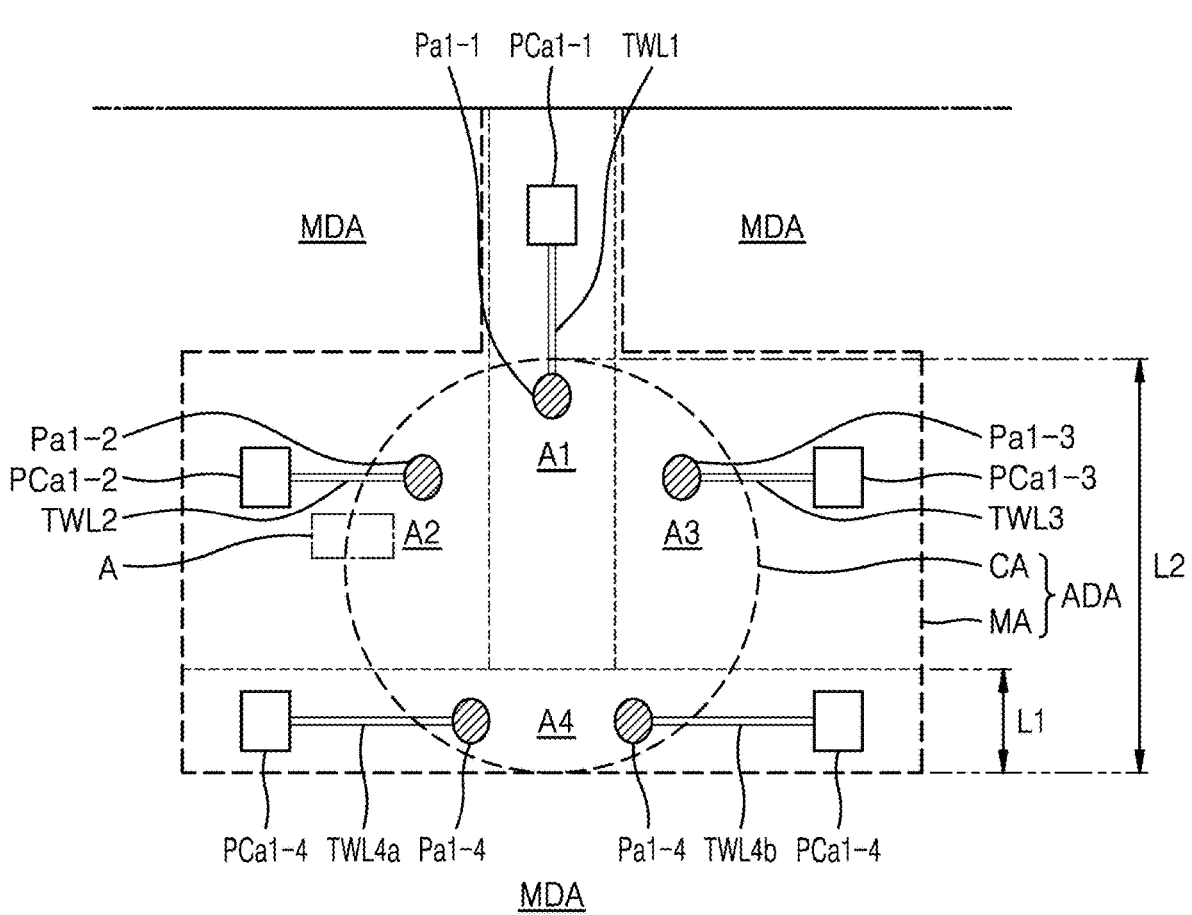
FIG. 10 is a schematic plan view of part of a display area of a display apparatus according to one or more embodiments, the display area including an auxiliary display area.

FIG. 10 is a schematic plan view of part of a display area of a display apparatus according to one or more embodiments, the display area including the auxiliary display area NDA.

Referring to FIG. 10, the auxiliary display area ADA may include the component area CA and the middle area MA that at least partially surrounds the component area CA.

In an embodiment, the auxiliary display area ADA may include a first area A1 that includes a center portion of the component area CA and part of the middle area MA, and a second area A2, a third area A3, and a fourth area A4, each of the second area A2, the third area A3, and the fourth area A4 including part of the component area CA and part of the middle area MA. The second area A2 may be arranged at one side of the first area A1, and the third area A3 may be arranged at the other side of the first area A1. In other words, the second area A2 and the third area A3 may be arranged symmetrically with respect to the first area A1. The fourth area A4 may be arranged below the first area A1, the second area A2, and the third area A3, and may be in contact with the first area A1, the second area A2, the third area A3, and the main display area MDA.

A first connection wiring TWL1 to a fourth connection wiring TWL4 may be arranged in the first area A1 to the fourth area A4, respectively, and in the auxiliary display area ADA, the first area A1 to the fourth area A4 may be areas that are divided based on the arrangement relation of the first connection wiring TWL1 to the fourth connection wiring TWL4.

The first area A1 may extend in the +Y direction from the center portion of the component area CA to the non-display area NDA. A first-1 auxiliary display element Pa1-1 m ay be arranged in the component area CA corresponding to the first area A1, and a first-1 auxiliary pixel circuit PCa1-1 may be arranged in the middle area MA. The first-1 auxiliary display element Pa1-1 and the first-1 auxiliary pixel circuit PCa1-1 may be connected to each other by the first connection wiring TWL1. The first connection wiring TWL1 may extend in a first direction, for example, in the Y direction, in the first area A1.

A first-2 auxiliary display element Pa1-2 may be arranged in the component area CA corresponding to the second area A2, and a first-2 auxiliary pixel circuit PCa1-2 may be arranged in the middle area MA. The first-2 auxiliary display element Pa1-2 and the first-2 auxiliary pixel circuit PCa1-2 may be connected to each other by a second connection wiring TWL2. The second connection wiring TWL2 may extend in a second direction, for example, in the X direction, in the second area A2.

Similar to the second area A2, a first-3 auxiliary display element Pa1-3 may be arranged in the component area CA corresponding to the third area A3, and a first-3 auxiliary pixel circuit PCa1-3 may be arranged in the middle area MA. The first-3 auxiliary display element Pa1-3 and the first-3 auxiliary pixel circuit PCa1-3 may be connected to each other by a third connection wiring TWL3. The third connection wiring TWL3 may extend in the second direction, for example, in the X direction, in the third area A3.

A first-4 auxiliary display element Pa1-4 may be arranged in the component area CA corresponding to the fourth area A4, and a first-4 auxiliary pixel circuit PCa1-4 may be arranged in the middle area MA. The first-4 auxiliary display element Pa1-4 and the first-4 auxiliary pixel circuit PCa1-4 may be connected to each other by the fourth connection wiring TWL4. The fourth connection wiring TWL4 may extend in the second direction, for example, in the X direction, in the fourth area A4.

In an embodiment, the fourth connection wiring TWL4 in the fourth area A4 may include fourth connection wirings TWL4-1 and TWL4-2 arranged to face each other. The fourth connection wirings TWL4-1 and TWL4-2 may be arranged symmetrical to an imaginary center line passing the center of the fourth area A4. For example, the imaginary center line passing the center of the fourth area A4 may be a center line passing the center of the component area CA. In this state, the center of the component area CA may mean the center of a figure forming a shape of the component area CA.

Referring to FIG. 10, the fourth area A4 may be in contact with the first area A1, the second area A2, and the third area A3 above, and the main display area MDA below. The fourth area A4 may include part of the component area CA arranged in a direction, for example, in a-Y direction, in which the first area A1 extends. In a comparative example, when a case in which the first area extends toward the main display area is assumed, the maximum length of the first connection wiring arranged in the first area increases further, and thus a problem occurs in which the resistance of the first connection wiring increases as well.

Accordingly, in an embodiment of the disclosure, a hybrid structure of arranging together the first connection wiring TWL1 in the first area A1 that extends in the first direction, for example, in the Y direction, the second connection wiring TWL2, and the third connection wiring TWL3 and the fourth connection wiring TWL4 in the second area A2, the third area A3, and the fourth area A4, respectively, which extend in the second direction, for example, in the X direction, may be employed. According to the above structure, as the first area A1 to the fourth area A4 each divide the auxiliary display area ADA to include the component area CA and the middle area MA, and particularly, the fourth area A4 is arranged between the first area A1 and the main display area MDA, the length of the first connection wiring TWL1 extending in the first direction, for example, in the X direction, is decreased so that resistance according to the length of a connection wiring extending in a specific direction may be efficiently controlled.

In an embodiment, to increase the above-described effect, a first width L1 of the fourth area A4 in the first direction, for example, in the Y direction, may be about 25%, or about ¼, of a second width L2 of the component area CA in the first direction, for example, in the Y direction. In this state, the second width L2 of the component area CA may mean the maximum value of the width in the first direction, for example, in the Y direction. For example, when the shape of the component area CA is circular, the second width L2 may mean the diameter of the component area CA. As such, when the first width L1 of the fourth area A4 is secured as a position that is ¼ of the second width L2 of the component area CA, the lengths of the first connection wiring TWL1 arranged in the first area A1 and the fourth connection wiring TWL4 arranged in the fourth area A4 may be optimally designed.

The first connection wiring TWL1 to the fourth connection wiring TWL4 may include a transparent conductive material, and may be formed as a TCO film of, for example, IGZO, ITO, IZO, ZnO or In$_2$O$_3$, or the like. Accordingly, an area of the component area CA, in which the first auxiliary subpixel Pa1 is not arranged, may all be provided as the transmission area TA, regardless of the arrangement of the first connection wiring TWL1 to the fourth connection wiring TWL4.

Figure 11:
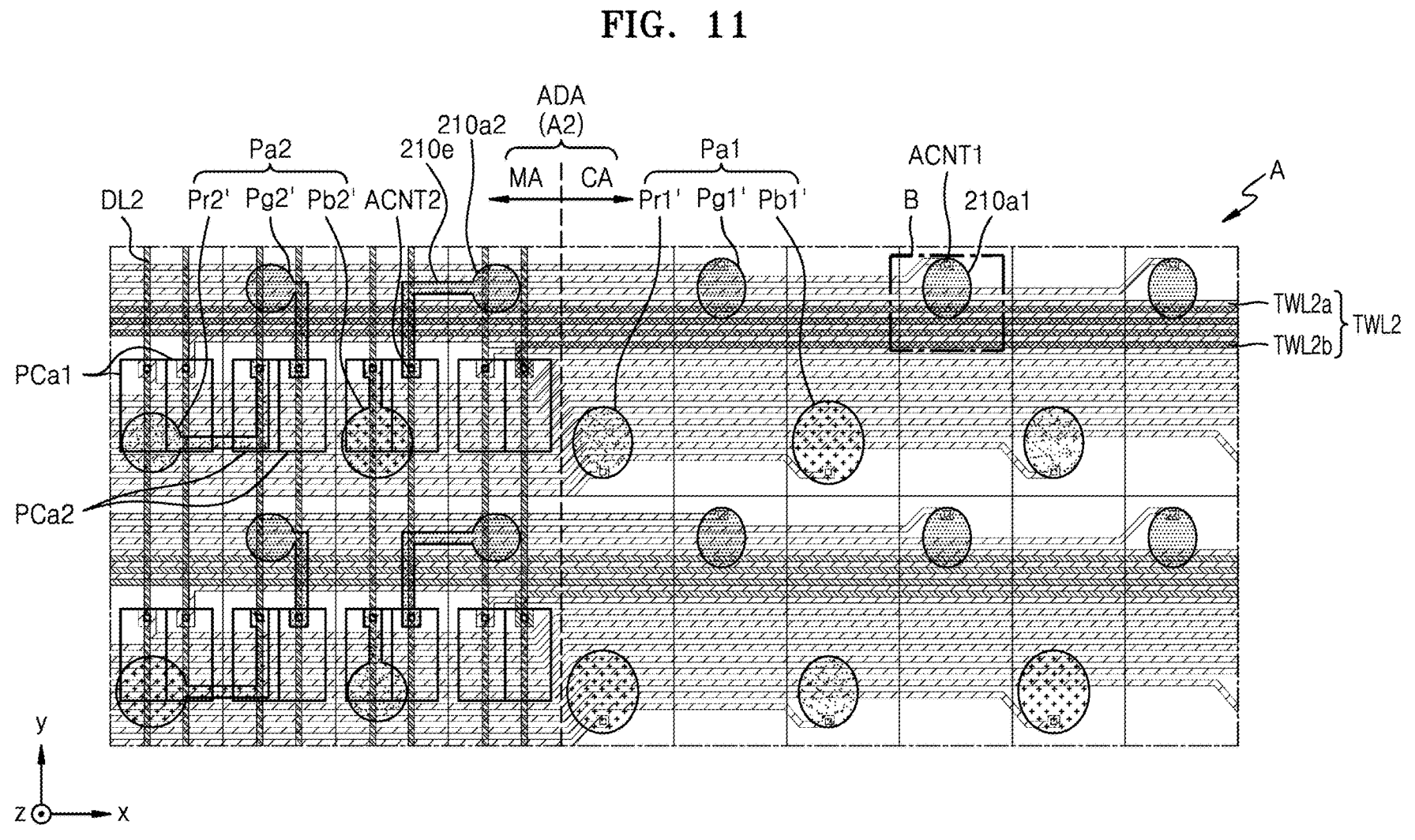
Figure 12:
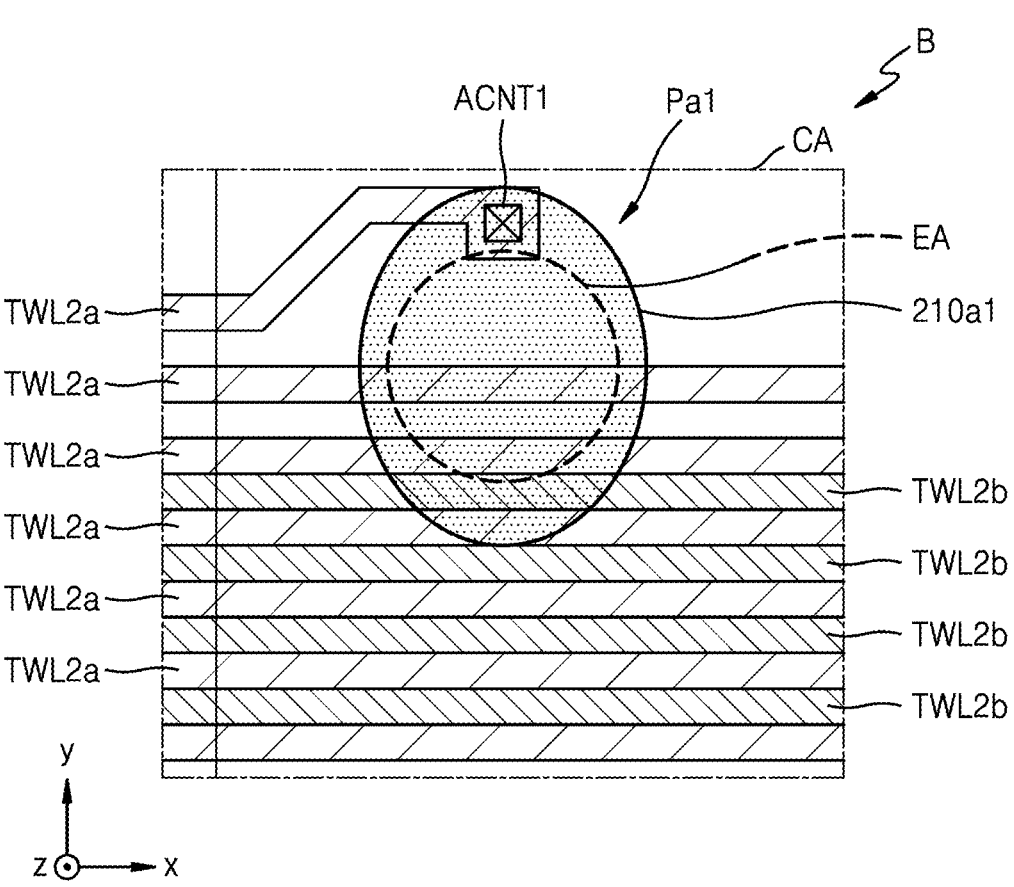
FIG. 12 is a plan view of part of the auxiliary display area of FIG. 11 by enlarging the same.

FIG. 11 is a detailed plan view of part of the auxiliary display area ADA of FIG. 10. FIG. 12 is an enlarged plan view of a portion B of the auxiliary display area ADA of FIG. 11.

The structure of the auxiliary display area ADA is described below in detail with reference to FIGS. 11 and 12.

FIG. 11 illustrates a part of the second area by enlarging the same. FIG. 11 illustrates a portion corresponding to a portion A of FIG. 10. Referring to FIG. 11, the first auxiliary subpixel Pa1 may be arranged in the component area CA corresponding to the second area A2. In this state, the first auxiliary subpixel Pa1 arranged in the component area CA corresponding to the second area A2 may substantially mean the first-2 auxiliary display element Pa1-2 corresponding to a light-emitting device, that is, an OLED. The first auxiliary subpixel Pa1 may emit any one of red, green, blue, and white light. In an embodiment, the first auxiliary subpixel Pa1 may include a first red auxiliary subpixel a first green auxiliary subpixel Pg1', and a first blue auxiliary subpixel Pr1'.

As illustrated in FIG. 11, a pixel circuit for driving the first-2 auxiliary display element Pa1-2 may not be arranged below the first-2 auxiliary display element Pa1-2. In an embodiment, the first-2 auxiliary pixel circuit PCa1-2 for driving the first-2 auxiliary display element Pa1-2 may be arranged in the middle area MA corresponding to the second area A2.

The second connection wiring TWL2 may be arranged to extend in the second direction, for example, in the X direction. The second connection wiring TWL2 may be arranged in a direction crossing, for example, being perpendicular to, a second data line DL2 that extends in the first direction, for example, in the Y direction.

The first-2 auxiliary pixel circuit PCa1-2 may be connected to the first-2 auxiliary display element Pa1-2 through the second connection wiring TWL2. In an embodiment, the second connection wiring TWL2 may include a second-1 connection wiring TWL2a and a second-2 connection wiring TWL2b, which are alternately arranged on a plane (i.e., plan view). The second-1 connection wiring TWL2a and the second-2 connection wiring TWL2b may be arranged on different layers. Accordingly, by further decreasing a distance between the second connection wirings TWL2, the resolution of the component area CA may be increased, and defects such as a short circuit or the like between the second connection wirings TWL2 may be effectively prevented.

The second auxiliary subpixel Pa2 and the second auxiliary pixel circuit PCa2 may be arranged in the middle area MA corresponding to the second area A2. In this state, the second auxiliary subpixel Pa2 arranged in the middle area MA corresponding to the second area A2 may substantially mean a display element, that is, OLED, corresponding to the light-emitting device. The second auxiliary subpixel Pa2 may emit any one of red, green, blue, and white light. In an embodiment, the second auxiliary subpixel Pa2 may include a second red auxiliary subpixel Pr2', a second green auxiliary subpixel Pg2', and a second blue auxiliary subpixel Pb2'.

The second auxiliary pixel circuit PCa2 may be arranged to overlap the second auxiliary subpixel Pa2 in the plan view, or adjacent to the second auxiliary subpixel Pa2. The second auxiliary subpixel Pa2 may be directly connected to the second auxiliary pixel circuit PCa2, without the second connection wiring TWL2.

The first auxiliary pixel circuit PCa1 and the second auxiliary pixel circuit PCa2 may be arranged in the middle area MA. In an embodiment, the first auxiliary pixel circuit PCa1 and the second auxiliary pixel circuit PCa2 may be arranged adjacent to each other and alternately. As described above in FIG. 6 or the like, each of the first auxiliary pixel circuit PCa1 and the second auxiliary pixel circuit PCa2 may be arranged as two pixel circuits form a pair.

In an embodiment, assuming that the first auxiliary subpixel Pa1 and the second auxiliary subpixel Pa2 are arranged in a matrix having rows and columns, the first auxiliary pixel circuit PCa1 and the second auxiliary pixel circuit PCa2 may be arranged in even-numbered rows or odd-numbered rows. In other words, the first auxiliary pixel circuit PCa1 and the second auxiliary pixel circuit PCa2 are not continuously arranged in every row. For example, when arranged in even-numbered rows, the first auxiliary pixel circuit PCa1 and the second auxiliary pixel circuit PCa2 may not be arranged in odd-numbered rows. Through the above arrangement of pixel circuits, the resolution of the auxiliary display area ADA may be further lowered, compared to the resolution of the main display area MDA.

The first auxiliary subpixel Pa1 arranged in the component area CA may include a first auxiliary pixel electrode 210a1.

Referring to FIGS. 11 and 12 together, the first auxiliary pixel electrode 210a1 may have a curved shape having no corner or corner portion where a straight line meets a straight line. In an embodiment, in the present embodiment, although a case in which the first auxiliary pixel electrode 210a1 is provided as an oval shape is illustrated, the disclosure is not limited thereto. The shape of the first auxiliary pixel electrode 210a1 may include a circular shape, an oval shape, a partially circular shape, or a partially oval shape in another embodiment. As such, as the first auxiliary pixel electrode 210a1 is formed in a curved shape, diffraction of light passing through the transmission area TA of the component area CA may be reduced.

As the second connection wiring TWL2 is in direct contact with the first auxiliary pixel electrode 210a1, a signal of the first auxiliary pixel circuit PCa1 located in the middle area MA may be transmitted to the first auxiliary pixel electrode 210a1. Although FIG. 12 illustrates that the second-1 connection wiring TWL2a is connected to the first auxiliary pixel electrode 210a1, the first auxiliary pixel electrode 210a1 may be connected to the second-2 connection wiring TWL2b.

The second connection wiring TWL2 may be connected to the first auxiliary pixel electrode 210a1 through a first contact portion ACNT1. The first contact portion ACNT1 may be defined in an insulating layer provided between the second connection wiring TWL2 and the first auxiliary pixel electrode 210a1. In an embodiment, the first contact portion ACNT1 may be arranged at one side of the first auxiliary pixel electrode 210a1 to overlap the first auxiliary pixel electrode 210a1 in the plan view. In this case, however, the first contact portion ACNT1 may not overlap the emission area EA of the first auxiliary subpixel Pa1 in the plan view. The emission area EA may be defined through the opening 1200P of the pixel defining layer 120 arranged in the first auxiliary pixel electrode 210a1.

As the first contact portion ACNT1 is arranged not to overlap the emission area EA in the plan view, the deterioration of color coordinates due to a decrease in the flatness of the emission area EA by the first contact portion ACNT1 may be effectively prevented. As described above, as the first auxiliary pixel electrode 210a1 is provided to substantially have an oval shape, by providing the first contact portion ACNT1 at one side in a major axis direction, the first contact portion ACNT1 may be implemented not to overlap the emission area EA in the plan view.

Referring to FIG. 11 again, the second auxiliary subpixel Pa2 arranged in the middle area MA may include a second auxiliary pixel electrode 210a2. The second auxiliary pixel electrode 210a2 is provided to be approximately circular, and may include an extension portion 210e extending toward one side. A second contact portion ACNT2 may be formed at an end portion of the extension portion 210e. The second auxiliary pixel circuit PCa2 may be connected to the second auxiliary pixel electrode 210a2 through the second contact portion ACNT2. As the second auxiliary pixel electrode 210a2 has the extension portion 210e extending to one side, the second auxiliary pixel electrode 210a2 may be arranged not to completely overlap the second auxiliary pixel circuit PCa2 in the plan view for driving the second auxiliary pixel electrode 210a2.

The arrangement and structure of the first auxiliary pixel electrode 210a1 and the second auxiliary pixel electrode 210a2 in the second area A2, which are described above with reference to FIG. 11, may be identically applied to the first area A1, the third area A3, and the fourth area A4 with only a difference in the direction in which each of the connection wirings, for example, the first connection wiring TWL1, the third connection wiring TWL3, and the fourth connection wiring TWL4, extends,.

Figure 13:
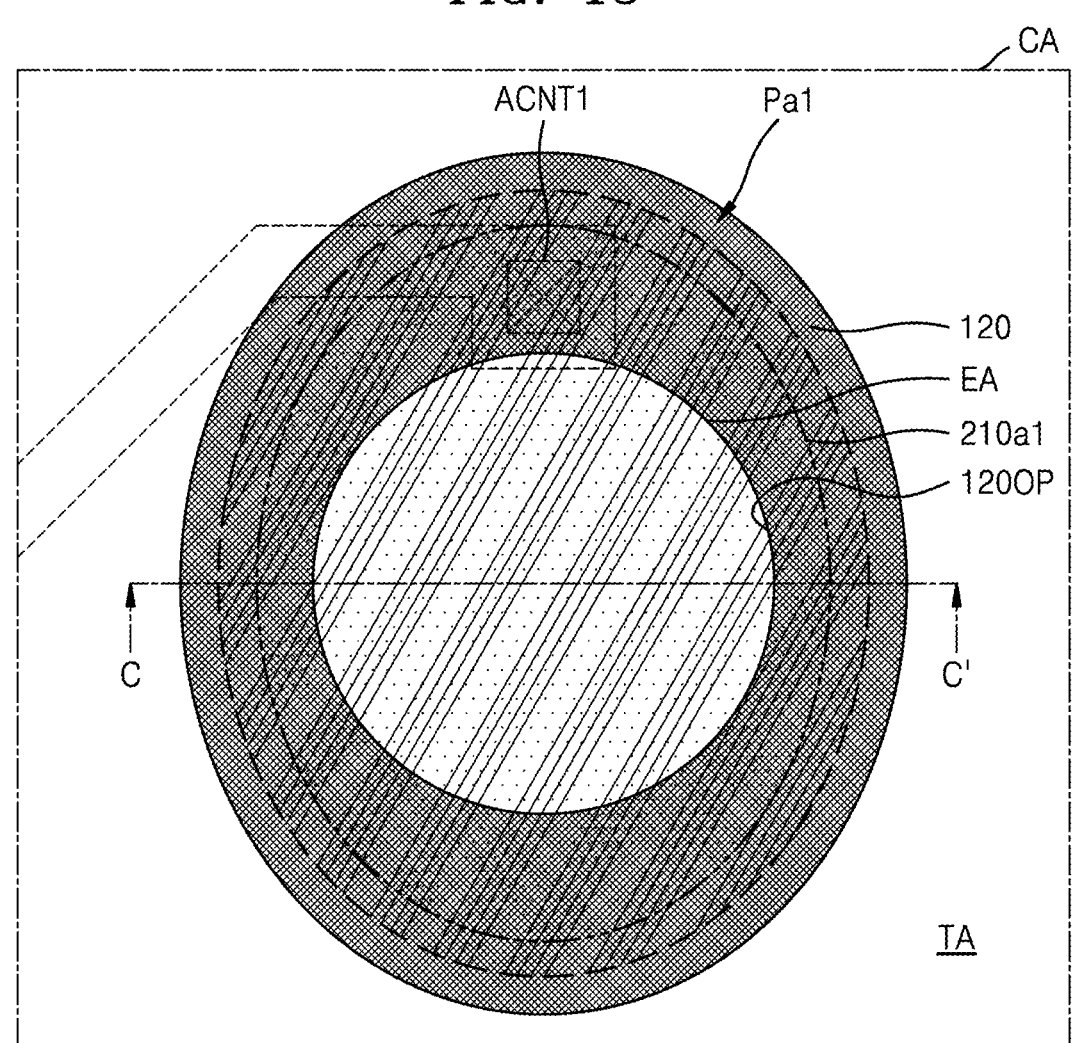
FIG. 13 is a schematic plan view of a first auxiliary subpixel according to one or more embodiments.

FIG. 13 is a schematic plan view of the first auxiliary subpixel Pa1 according to one or more embodiments. FIGS. 14 to 17 are schematic cross-sectional views of the first auxiliary subpixel Pa1 taken along line C-C' of FIG. 13.

Figure 14:
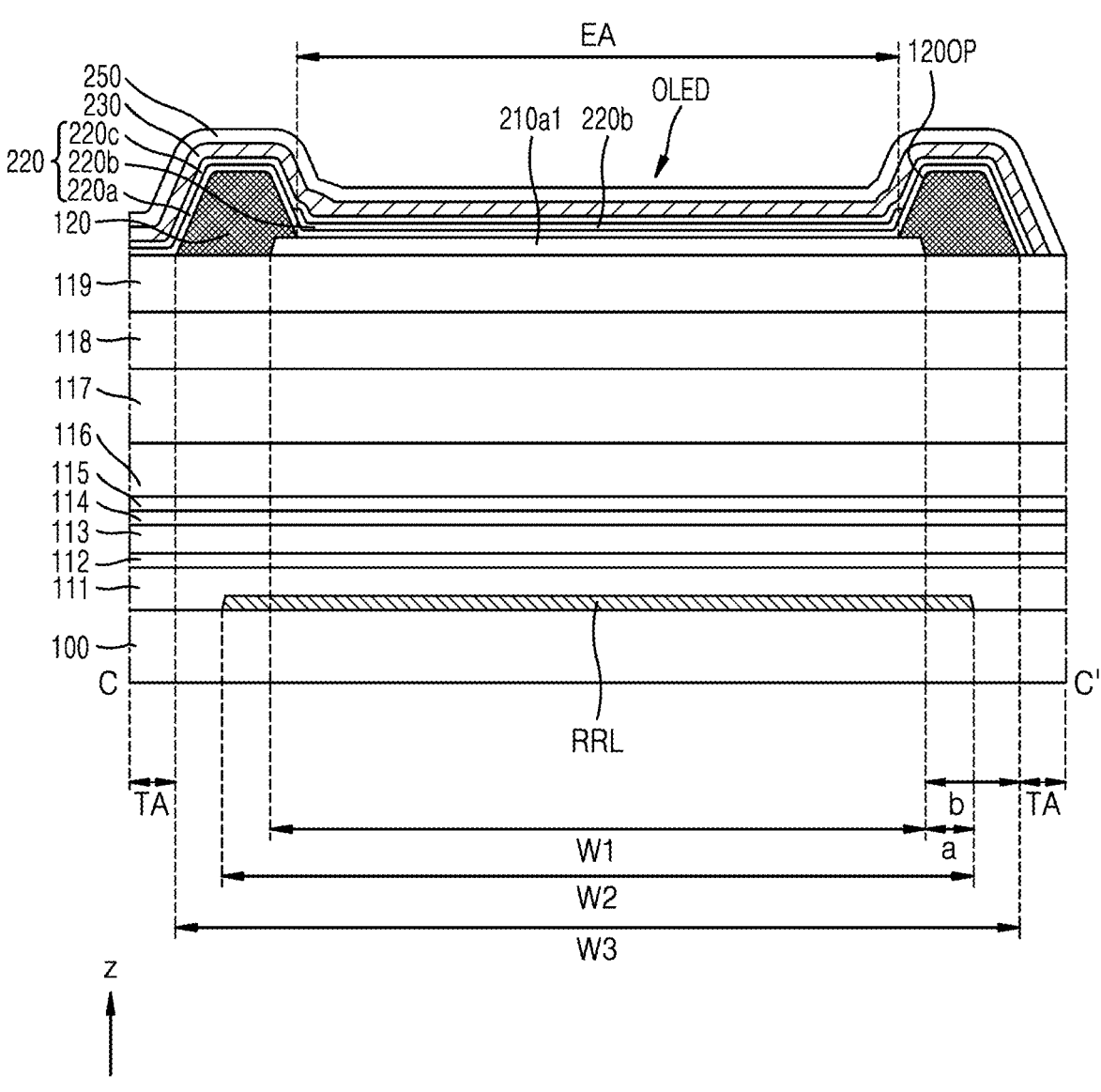
FIGS. 14 to 17 are schematic cross-sectional views of the first auxiliary subpixel taken along line C-C' of FIG. 13.

Referring to FIGS. 13 and 14, the first auxiliary subpixel Pa1 may further include the first auxiliary pixel electrode 210a1. The pixel defining layer 120 may be arranged on the first auxiliary pixel electrode 210a1. The pixel defining layer 120 may have the opening 1200P that covers an edge of the first auxiliary pixel electrode 210a1 and exposes a central portion of the first auxiliary pixel electrode 210a1.

In an embodiment, the pixel defining layer 120 may include a light shield material. For example, the pixel defining layer 120 may include an insulating material (the pixel defining layer 120 may be an insulating layer), for example, an organic insulating material, including a pigment or dye in a black color. As such, the pixel defining layer 120 provided as a light shield film may prevent a mixed color between neighboring pixels and improve visibility by absorbing light reflected by the component 20.

As such, as the pixel defining layer 120 includes a light shield material, the pixel defining layer 120 arranged in the component area CA may be provided by being patterned for each first auxiliary subpixel Pa1. Accordingly, the pixel defining layer 120 may be arranged spaced apart from each other in an island form for each the first auxiliary subpixel Pa1. An area of the component area CA, in which the first auxiliary pixel electrode 210a1 and the pixel defining layer 120 are not arranged, may function as the transmission area TA.

A reflection reduction layer RRL may be arranged between the substrate 100 and the first auxiliary pixel electrode 210a1 to correspond to the first auxiliary pixel electrode 210a1. As the reflection reduction layer RRL is formed of or includes a material having reflectivity lower than reflectivity of the first auxiliary pixel electrode 210a1, reflectivity due to the first auxiliary pixel electrode 210a1 is reduced so that an image distortion phenomenon, for example, flare, in the component area CA may be effectively prevented or reduced.

The reflection reduction layer RRL may completely overlap/cover the first auxiliary pixel electrode 210a1 in the plan view. As the reflection reduction layer RRL completely overlap, on a plane, the first auxiliary pixel electrode 210a1, a width W2 of the reflection reduction layer RRL in one direction on a plane perpendicular to the Z direction may be equal to or greater than a width W1 of the first auxiliary pixel electrode 210a1 in the one direction. However, as the transmission area TA of the component area CA is controlled by the area of the pixel defining layer 120 that is colored, to prevent reduction of the transmission area TA, the width W2 of the reflection reduction layer RRL may be equal to or less than a width W3 of the pixel defining layer 120. In other words, the minimum value of the width W2 of the reflection reduction layer RRL in one direction may be equal to the width W1 of the first auxiliary pixel electrode 210a1, and the maximum value of the width W2 of the reflection reduction layer RRL may be equal to the width W3 of the pixel defining layer 120. When a width difference between the first auxiliary pixel electrode 210a1 and the reflection reduction layer RRL is "a," and a width difference between the first auxiliary pixel electrode 210a1 and the pixel defining layer 120 is "b," Inequality 1 below may be satisfied.

$$0 \leq a \leq b \qquad \text{[Inequality 1]}$$

The reflection reduction layer RRL may include a material having reflectivity lower than a reflectivity of the first auxiliary pixel electrode 210a1. In detail, the first auxiliary pixel electrode 210a1 may include Ag, and may have a three-layer structure, for example, Ag/ITO/Ag. As Ag is a metal having high reflectivity, the reflection reduction layer RRL may include a material having reflectivity lower than a reflectivity of Ag. The reflection reduction layer RRL may include a material having reflectivity lower than a reflectivity of the first auxiliary pixel electrode 210a1, for example, a metal material, a silicon-based material, a colored organic material, or the like. The reflection reduction layer RRL may include, for example, a metal material such as Mo, Al, Ti, a-Si, or the like, an inorganic film such as SiOx, SiON, SiNx, or the like, or a composite film structure thereof.

In an embodiment, the reflection reduction layer RRL may include a metal layer including a metal material, as illustrated in FIG. 14. In this case, the reflection reduction layer RRL may include the same material as the bottom metal layer BML illustrated in FIG. 8 or the like. In this case, the reflection reduction layer RRL may include, for example, Mo, a-Si, SiON, or the like.

In another embodiment, when the reflection reduction layer RRL includes a metal material, the material of at least one of metal layers forming the first auxiliary pixel circuit PCa1 may be used as the metal material, and the reflection reduction layer RRL may be formed by using at least one of, for example, the gate electrodes G1 and G2, the source electrodes S1 and S2, or the drain electrodes D1 and D2 of the thin film transistors S-TFT and O-TFT, by referring to FIG. 8 or the like.

Figure 15:
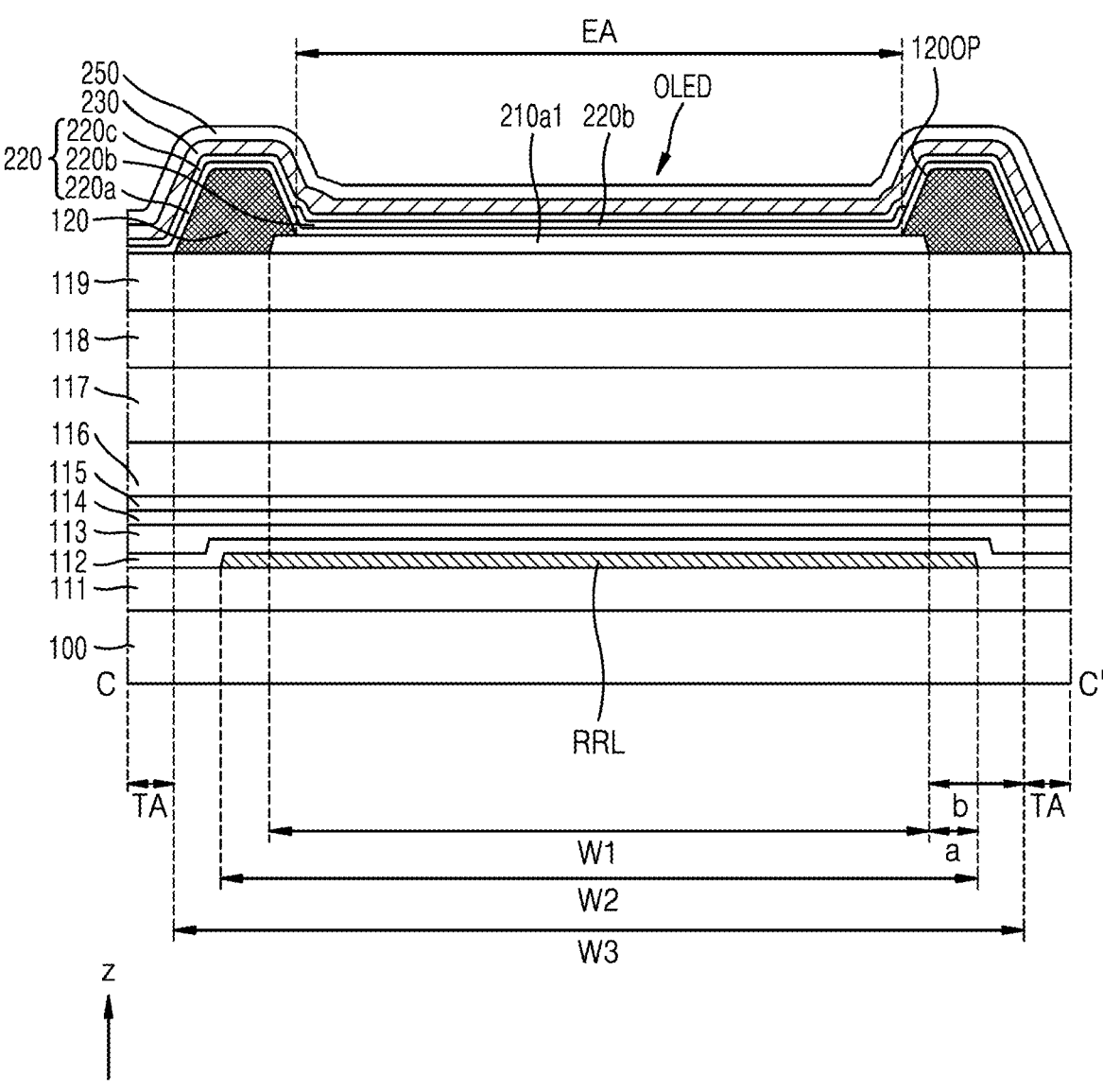

Furthermore, in an embodiment, the reflection reduction layer RRL may include a silicon-based semiconductor material as illustrated in FIG. 15. The reflection reduction layer RRL may include, for example, amorphous silicon a-Si or poly silicon p-Si.

Figure 16:
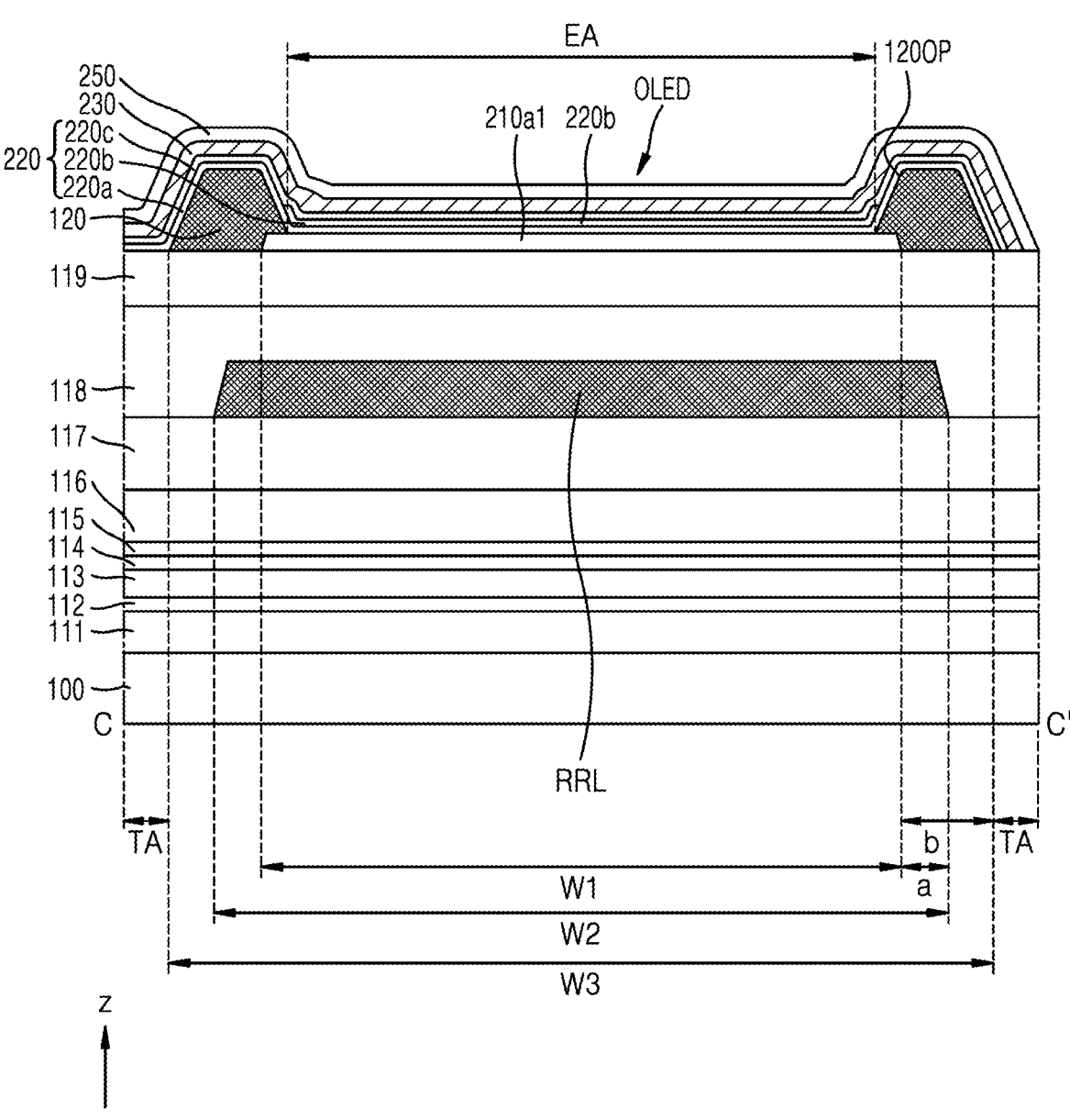

Furthermore, in an embodiment, the reflection reduction layer RRL may include a colored organic material as illustrated in FIG. 16. In other words, the reflection reduction layer RRL may be provided as an organic layer including a colored, for example, black, pigment. In FIG. 16, the reflection reduction layer RRL may be formed in a separate process, or without an additional process by using an organic insulating layer arranged in the middle area MA and the main display area MDA on the same layer as the reflection reduction layer RRL. In this case, the organic insulating layer may function as a planarization insulation layer such as the second organic insulating layer 118 and the third organic insulating layer 119 in FIG. 8 or the like.

Figure 17:
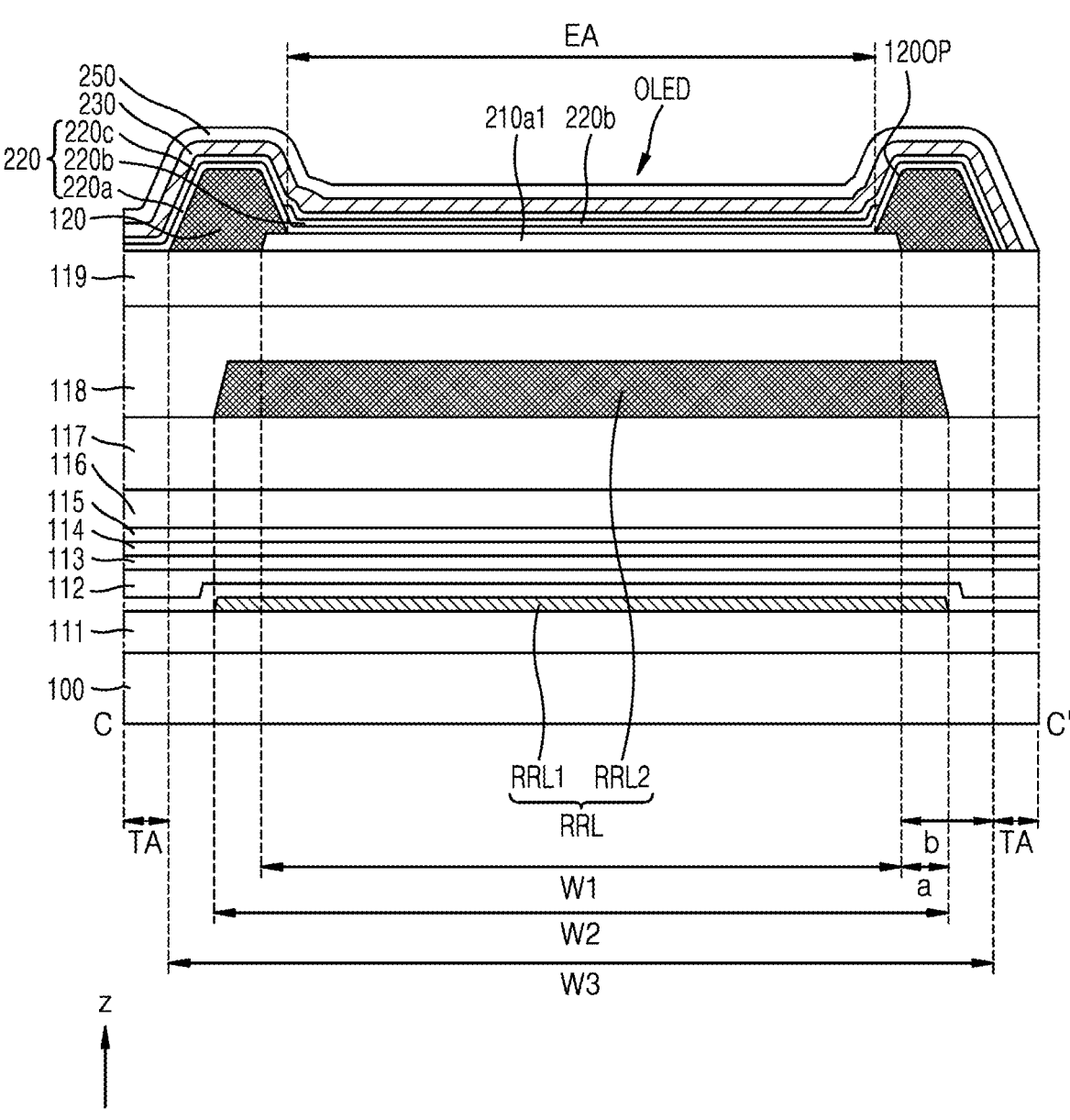

Although, in the above-described embodiments of FIGS. 14 to 16, the reflection reduction layer RRL is provided as one layer, in another embodiment, as illustrated in FIG. 17, the reflection reduction layer RRL may be provided as two or more layers. The reflection reduction layer RRL may include a first reflection reduction layer RRL1 and a second reflection reduction layer RRL2 overlapping each other in the plan view. FIG. 17 illustrates an embodiment to which the configurations of FIGS. 15 and 16 are simultaneously applied. In other words, the first reflection reduction layer RRL1 may include a silicon-based semiconductor material, and the second reflection reduction layer RRL2 may include an organic material including a black pigment.

Figure 18:
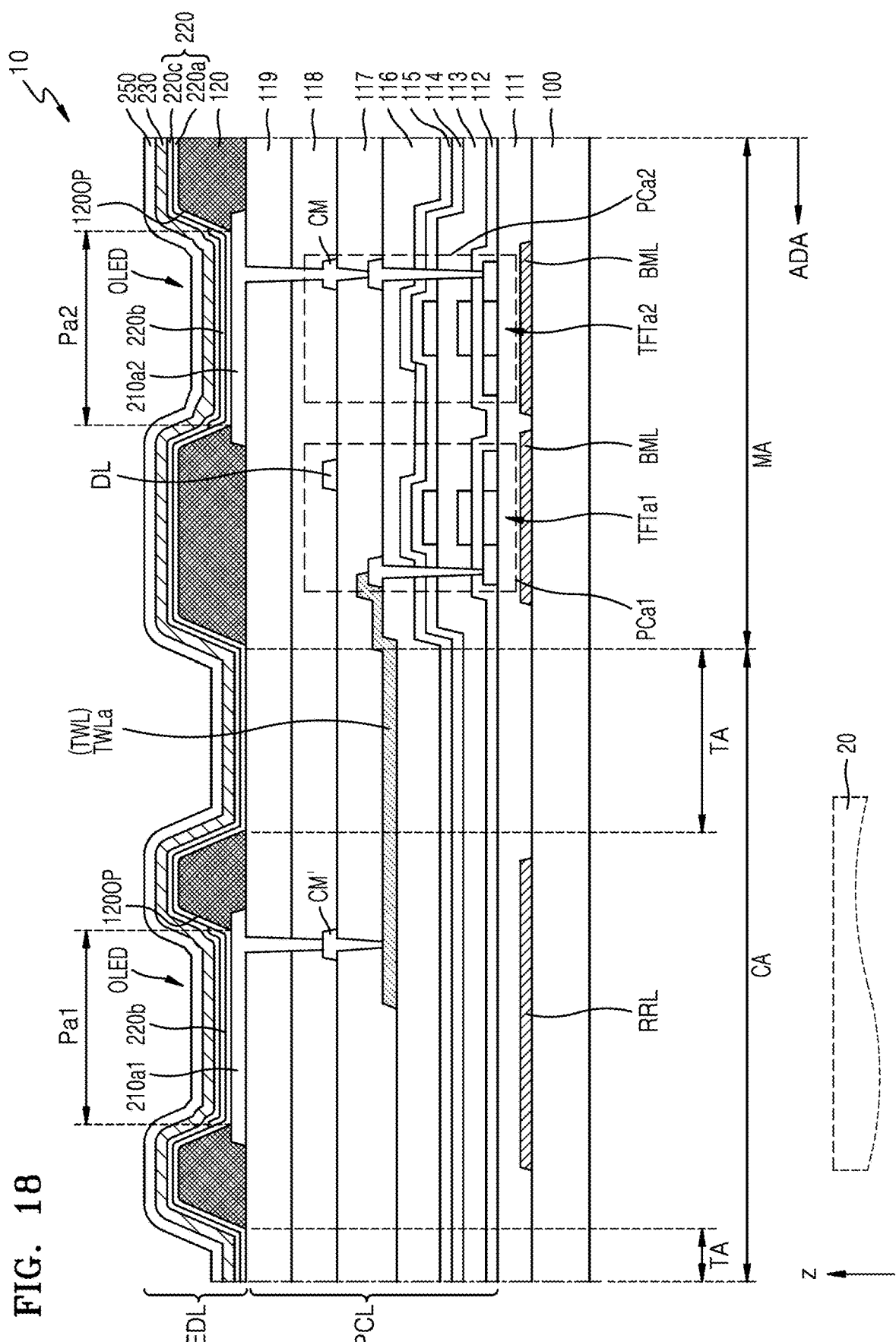
FIGS. 18 and 19 are schematic cross-sectional views of part of the auxiliary display area of a display apparatus according to one or more embodiments.
Figure 19:
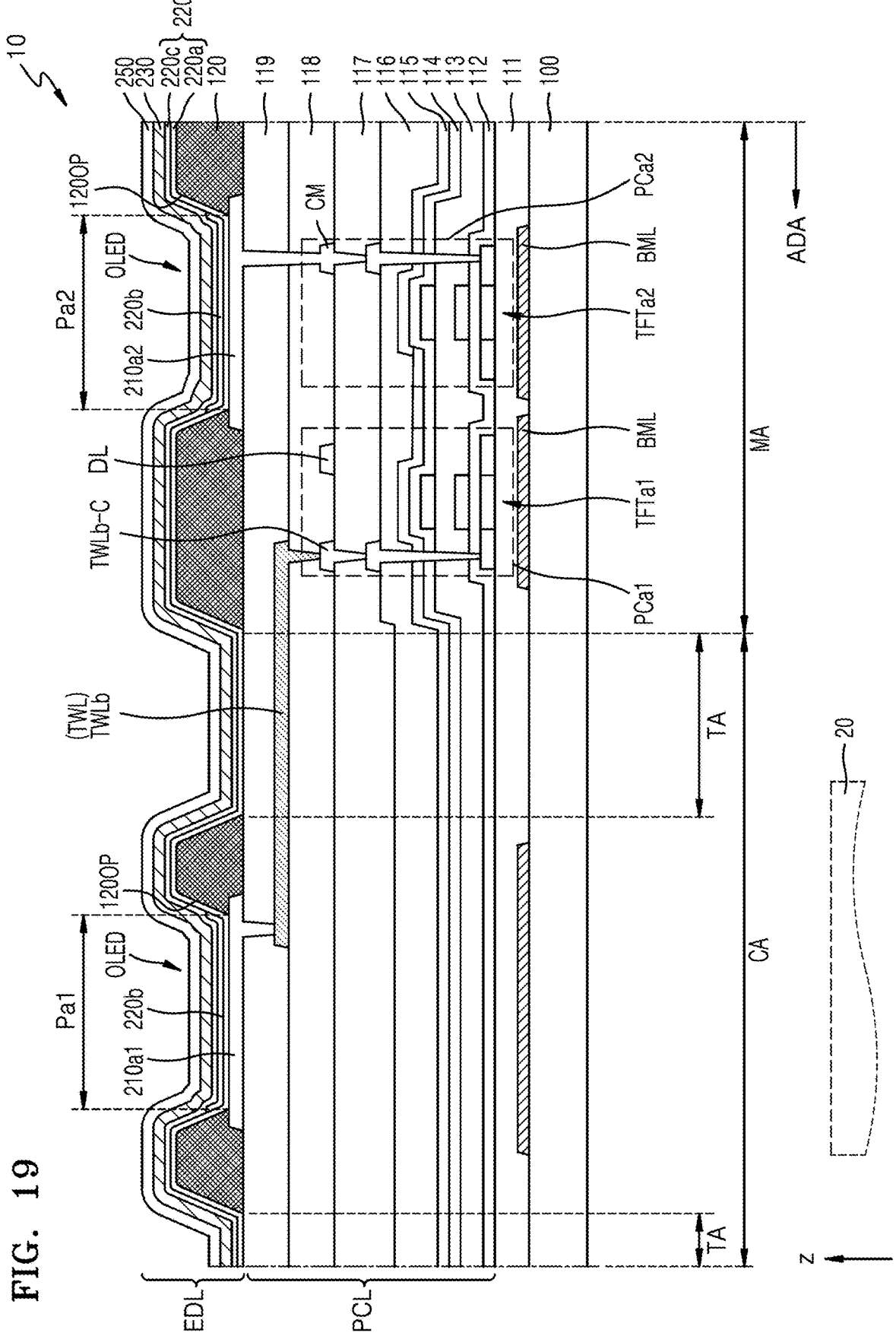

FIGS. 18 and 19 are schematic cross-sectional views of part of the auxiliary display area of a display apparatus according to one or more embodiments.

Referring to FIG. 18, the first auxiliary subpixel Pa1 may be arranged in the component area CA of the auxiliary display area ADA, and the second auxiliary subpixel Pa2 may be arranged in the middle area MA of the auxiliary display area ADA. The first auxiliary pixel circuit PCa1 and the second auxiliary pixel circuit PCa2 may be arranged in the middle area MA. The first auxiliary pixel circuit PCa1 and the second auxiliary pixel circuit PCa2 may be arranged adjacent to each other to neighbor each other. The first auxiliary pixel circuit PCa1 and the second auxiliary pixel circuit PCa2 each may be provided in multiple circuits and arranged alternately. For convenience of explanation and illustration, in FIG. 17, each of the first auxiliary pixel circuit PCa1 and the second auxiliary pixel circuit PCa2 includes a first thin film transistor TFT1 and a second thin film transistor TFT2, which are provided as silicon thin film transistors, and in detail, the first auxiliary pixel circuit PCa1 and the second auxiliary pixel circuit PCa2 each may include the above-described arrangement structure of FIG. 6, 7A to 7G, 9 or 10. Accordingly, the detailed descriptions in FIG. 9, 10, or the like are used for the first auxiliary pixel circuit PCa1 and the second auxiliary pixel circuit PCa2.

The first auxiliary subpixel Pa1 may be driven through the first auxiliary pixel circuit PCa1 arranged in the middle area MA, and the second auxiliary subpixel Pa2 may be driven through the second auxiliary pixel circuit PCa2 arranged in the middle area MA.

The first auxiliary subpixel Pa1 may be connected to the first auxiliary pixel circuit PCa1 through the connection wiring TWL. One end of the connection wiring TWL may be connected to the first auxiliary pixel circuit PCa1 , and the other end thereof may be connected to the first auxiliary pixel electrode 210*a*1. A contact electrode layer CM' is provided between the connection wiring TWL and the first auxiliary pixel electrode 210*a*1, and thus the connection wiring TWL and the first auxiliary pixel electrode 210*a*1 may be electrically connected to each other via contact electrode layer CM'

In an embodiment, as illustrated in FIG. 18, the connection wiring TWL may include a first transmissive conductive layer TWLa arranged on the third interlayer insulating layer 116. The first transmissive conductive layer TWLa may be directly connected to the first auxiliary pixel circuit PCa1. In another embodiment, the first transmissive conductive layer TWLa may be electrically connected to the first auxiliary pixel circuit PCa1 through a conductive line (not shown) arranged in a different layer.

Referring to FIG. 19, the first auxiliary subpixel Pa1 may be connected to the first auxiliary pixel circuit PCa1 through the connection wiring TWL. The connection wiring TWL of FIG. 19 may include a second transmissive conductive layer TWLb arranged on the second organic insulating layer 118. The second transmissive conductive layer TWLb may be connected to the first auxiliary pixel circuit PCa1 through a conductive line TWLb-C.

The connection wiring TWL of FIGS. 18 and 19 may be one of the first to fourth connection wirings TWL1, TWL2, TWL3, and TWL4 with reference to the above-described drawings. The first transmissive conductive layer TWLa and the second transmissive conductive layer TWLb arranged in different layers may correspond to a first-1 connection wiring TWL1*a* and a first-2 connection wiring TWL1*b*, or the second-1 connection wiring TWL2*a* and the second-2 connection wiring TWL2*b*, respectively, with reference to the above-described drawings.

In FIGS. 18 and 19, illustrated is an example structure in which the reflection reduction layer RRL is arranged on the substrate 100 to correspond to the first auxiliary subpixel Pa1. Although the example structure adopts the above-described embodiment of FIG. 14, it is possible to apply the structures of FIGS. 15 to 17.

Figures 20, 21:
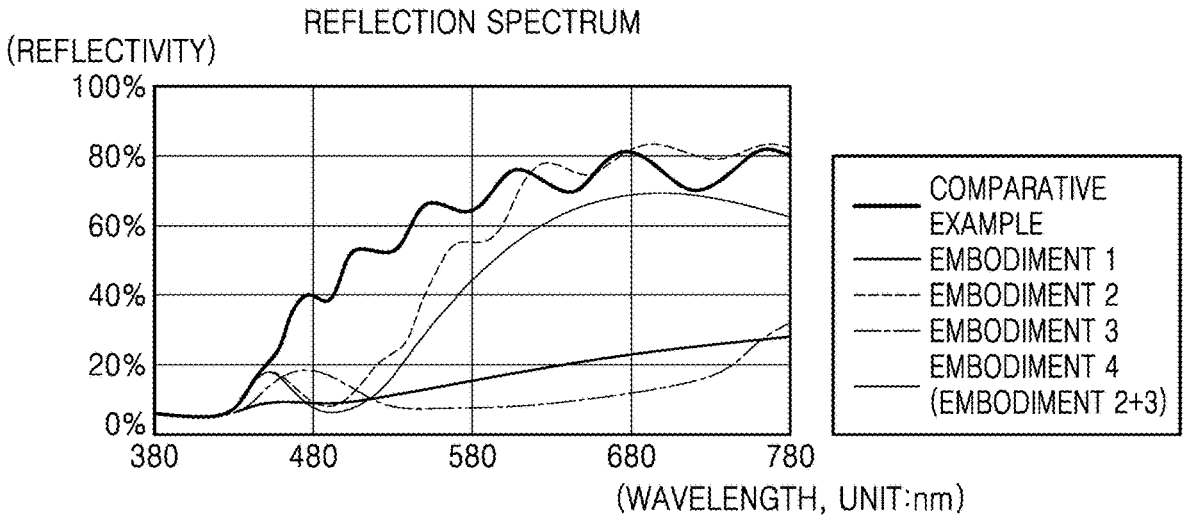
FIG. 20 is a table showing a measurement of reflectivity, according to one or more embodiments.
FIG. 21 is a graph showing a measurement of a reflection spectrum, according to one or more embodiments.

FIG. 20 is a table showing a measurement of reflectivity, according to one or more embodiments.

Referring to FIG. 20, in a comparative example, reflectivity was measured without applying the reflection reduction layer RRL according to one or more embodiments, and reflectivity was measured in each of Embodiment 1 that is the above-described embodiment of FIG. 14, Embodiment 2 that is the above-described embodiment of FIG. 15, and Embodiment 3 that is the above-described embodiment of FIG. 16.

FIG. 20 shows reflectivity to which the embodiments of the disclosure are applied in an experimental example (1/12 PXL) in which the first auxiliary subpixel Pa1 in the component area CA has a 1/12 pixel arrangement structure compared with the main display area MDA, and an experimental example (1-6 PXL) in which the first auxiliary subpixel Pa1 in the component area CA has a 1/6 pixel arrangement structure. First, it may be seen that the comparative example to which the reflection reduction layer RRL is not applied has reflectivity of 27.6% and 31.3%. In contrast, reflectivity was measured to be 13.3% and 12.8% in Embodiment 1, 27.1% and 30.6% in Embodiment 2, and 13.7% and 13.3% in Embodiment 3, and it may be seen that the reflectivity is remarkably low, compared to the above-described comparative example.

FIG. 21 is a graph showing a measurement of a reflection spectrum, according to one or more embodiments. FIG. 22 is a table showing a measurement of reflectivity of each subpixel, according to the graph of FIG. 21.

Referring to FIGS. 21 and 22, in a comparative example, reflectivity was measured without applying the reflection reduction layer RRL according to one or more embodiments, and reflectivity was measured in each of Embodiment 1 that is the above-described embodiment of FIG. 14, Embodiment 2 that is the above-described embodiment of FIG. 15, and Embodiment 3 that is the above-described embodiment of FIG. 16. Furthermore, reflectivity was measured in Embodiment 4 that is the above-described embodiment of FIG. 17.

First, the reflectivity of the comparative example of FIG. 21 generally appears to be higher, in all wavelength bands, than the reflectivity of embodiments of the disclosure, that is, Embodiment 1, Embodiment 2, Embodiment 3, and Embodiment 4. Although in some wavelength ranges, for example, exceeding about 600 nanometers (nm), the reflectivity of Embodiment 2 appears to be higher than the reflectivity of the comparative example, in the wavelength range of 600 nm or less, the reflectivity of Embodiment 2 was reduced much, compared with the comparative example. Accordingly, it may be seen that, even in Embodiment 2, the average reflectivity of a plurality of first auxiliary subpixels Pa1 are reduced much, compared to the comparative example.

In addition, it may be seen that, in Embodiments 1, 2, and 4, reflectivity is lower, in all wavelength bands, than the reflectivity of the comparative example.

Referring to the table of FIG. 22, a simulation result of reflectivity of each subpixel, for example, a red subpixel R, a green subpixel G, and a blue subpixel B, is shown.

For the blue subpixel B in a 440 nm to 460 nm wavelength range, the reflectivity of Embodiments 1, 2, 3, and 4 were measured to be 8.54%, 16.73%, 12.46%, and 16.70%, respectively, so that it may be seen that the reflectivity of Embodiments 1, 2, 3, and 4 are lower than 17.89% which is the reflectivity of the comparative example. Furthermore, for the green subpixel G in a 540 nm to 560 nm wavelength range, the reflectivity of Embodiments 1, 2, 3, and 4 were measured to be 11.09%, 19.33%, 7.90%, and 16.97%, respectively, so that it may be seen that the reflectivity of Embodiments 1, 2, 3, and 4 are lower than 28.29% which is the reflectivity of the comparative example. Furthermore, for the red subpixel R in a 640 nm to 660 nm wavelength range, the reflectivity of Embodiments 1 and 3 were measured to be 20.50% and 9.79%, respectively, so that it may be seen that the reflectivity of Embodiments 1 and 3 are lower than 33.38% which is the reflectivity of the comparative example. Although the reflectivity of Embodiments 2 and 4 were measured to be 68.64% and 65.46%, respectively, to be higher than the reflectivity of the comparative example, that is, 33.38%, with reference to the above-described graph of FIG. 21, it may be seen that, in a wavelength range of 640 nm or more, the average reflectivity of the red subpixel R, the green subpixel G, and the blue subpixel B is lower than the reflectivity of the comparative example.

According to one or more embodiments of the disclosure, implemented are display apparatuses which provide high quality images, and simultaneously in which the quality of images output through a component is effectively improved. The scope of the disclosure is not limited by the above effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
a substrate comprising a main display area and an auxiliary display area, the auxiliary display area comprising a component area and a middle area;
a main pixel circuit arranged in the main display area, and a main display element connected to the main pixel circuit;
a first auxiliary display element arranged in the component area;
a first auxiliary pixel circuit, a second auxiliary pixel circuit, and a second auxiliary display element connected to the second auxiliary pixel circuit, which are arranged in the middle area;
a connection wiring connecting the first auxiliary display element and the first auxiliary pixel circuit; and
a reflection reduction layer provided between the substrate and the first auxiliary display element,
wherein the first auxiliary display element comprises a first auxiliary pixel electrode, and the reflection reduction layer completely overlaps the first auxiliary pixel electrode in a plan view,
wherein the first auxiliary pixel electrode is provided in plurality, the reflection reduction layer is patterned to be separated in plurality in the plan view such that each pattern of the reflection reduction layer corresponds to each of the first auxiliary pixel electrodes in the plan view, and an area of each pattern of the reflection reduction layer is equal to or larger than an area of each of the first auxiliary pixel electrodes in the plan view.

2. The display apparatus of claim 1, wherein the reflection reduction layer comprises a first metal material.

3. The display apparatus of claim 2, wherein the first metal material has a reflectivity lower than a reflectivity of a second metal material included in the first auxiliary pixel electrode.

4. The display apparatus of claim 3, wherein the first metal material comprises at least one of molybdenum (Mo), aluminum (Al), or titanium (Ti).

5. The display apparatus of claim 2, further comprising:
a bottom metal layer provided between the substrate and the first auxiliary pixel circuit, and arranged to overlap the first auxiliary pixel circuit and the second auxiliary pixel circuit in the plan view,
wherein the reflection reduction layer comprises a same material as the bottom metal layer.

6. The display apparatus of claim 2, wherein the first auxiliary pixel circuit comprises a thin film transistor which comprises a semiconductor layer, a gate electrode, and an electrode layer connected to the semiconductor layer, and
the reflection reduction layer comprises a same material as the gate electrode.

7. The display apparatus of claim 2, wherein the first auxiliary pixel circuit comprises a thin film transistor which comprises a semiconductor layer, a gate electrode, and an electrode layer connected to the semiconductor layer, and
the reflection reduction layer comprises a same material as the electrode layer.

8. The display apparatus of claim 1, wherein the reflection reduction layer comprises a silicon-based semiconductor material.

9. The display apparatus of claim 1, wherein the reflection reduction layer comprises an organic material.

10. The display apparatus of claim 9, wherein the organic material comprises a colored light shield material.

11. The display apparatus of claim 1, further comprising:

an insulating layer covering an edge of the first auxiliary pixel electrode and exposing a central portion of the first auxiliary pixel electrode, wherein the insulating layer comprises a colored light shield material.

12. The display apparatus of claim 11, wherein a width of the reflection reduction layer is equal to or greater than a width of the first auxiliary pixel electrode.

13. The display apparatus of claim 12, wherein the width of the reflection reduction layer is equal to or less than a width of the insulating layer.

14. The display apparatus of claim 1, wherein, when viewed in a direction perpendicular to the substrate, an outline of the first auxiliary pixel electrode is curved.

15. The display apparatus of claim 14, wherein, when viewed in the direction perpendicular to the substrate, the first auxiliary pixel electrode has a circular or oval shape.

16. The display apparatus of claim 1, wherein the reflection reduction layer comprises a first reflection reduction layer and a second reflection reduction layer which completely overlap the first auxiliary pixel electrode in the plan view.

17. The display apparatus of claim 16, wherein the first reflection reduction layer and the second reflection reduction layer comprise materials different from each other.

18. The display apparatus of claim 1, wherein the connection wiring comprises a transmissive conductive layer.

19. The display apparatus of claim 1, wherein the component area comprises a first area and a second area, and the connection wiring comprises:

a first connection wiring extending in a first direction in the first area; and a second connection wiring extending in a second direction crossing the first direction in the second area.

20. The display apparatus of claim 1, wherein the first auxiliary display element comprises a plurality of first auxiliary display elements in the component area, the component area comprises a transmission area, and the transmission area is arranged between the first auxiliary display elements.

* * * * *